US012249381B2

(12) United States Patent
Shikata et al.

(10) Patent No.: US 12,249,381 B2
(45) Date of Patent: Mar. 11, 2025

(54) FASTER MULTI-CELL READ OPERATION USING REVERSE READ CALIBRATIONS

(71) Applicant: Micron Technology, Inc., Boise, ID (US)

(72) Inventors: Go Shikata, San Jose, CA (US); Kitae Park, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 185 days.

(21) Appl. No.: 18/117,268

(22) Filed: Mar. 3, 2023

(65) Prior Publication Data

US 2023/0326532 A1    Oct. 12, 2023

Related U.S. Application Data

(60) Provisional application No. 63/322,818, filed on Mar. 23, 2022.

(51) Int. Cl.
*G11C 16/26* (2006.01)
*G11C 16/08* (2006.01)
*G11C 16/24* (2006.01)

(52) U.S. Cl.
CPC .............. *G11C 16/26* (2013.01); *G11C 16/08* (2013.01); *G11C 16/24* (2013.01)

(58) Field of Classification Search
CPC ......... G11C 16/26; G11C 16/08; G11C 16/24; G11C 11/5642; G11C 16/0483
USPC .................................................. 365/189.011
See application file for complete search history.

(56) References Cited

U.S. PATENT DOCUMENTS 8,559,226 B2    10/2013  Abe
10,579,307 B2 *  3/2020  Miller .................... G11C 16/30
2019/0235954 A1 *  8/2019  Gim .................... G11C 11/5671

OTHER PUBLICATIONS

Kang et al., "256 3b/Cell V-NAND Flash Memory with 48 Stacked WL Layers", IEEE International Solid-State Circuits Conference, Session 7, Non-volatile Memory Solutions 7.1, 3 pages, Feb. 2, 2016.
Khakifirooz et al., "A 1Tb 4b/Cell 144-Tier Floating-Gate 3D-NAND Flash Memory with 40MB/s Program Throughput and 13.8Gb/mm2 Bit Density", IEEE International Solid-State Circuits Conference, Session 30, Non-volatile Memories 30.2, 3 pages, Feb. 18, 2021.

* cited by examiner

*Primary Examiner* — Huan Hoang
(74) *Attorney, Agent, or Firm* — Lowenstein Sandler LLP

(57) ABSTRACT

A memory device having a memory array with a plurality of memory cells electrically coupled to a plurality of wordlines and a plurality of bitlines and control logic coupled with the memory array. The control logic perform operations including: determining a metadata value characterizing a first read level voltage of a highest threshold voltage distribution of a subset of the plurality of memory cells, wherein the metadata value comprises at least one of a failed byte count or a failed bit count; adjusting, based on the metadata value, a second read level voltage for a second-highest threshold voltage distribution of the subset of the plurality of memory cells; and causing, to perform an initial calibrated read of the subset of the plurality of memory cells, the adjusted second read level voltage to be applied to a wordline of the plurality of wordlines to read the second-highest threshold voltage distribution.

20 Claims, 17 Drawing Sheets

FASTER MULTI-CELL READ OPERATION USING REVERSE READ CALIBRATIONS

REFERENCE TO RELATED APPLICATION

This application claims the benefit of U.S. Provisional Patent Application No. 63/322,818, filed Mar. 23, 2022, the entirety of which is incorporated herein by reference.

TECHNICAL FIELD

Embodiments of the disclosure are generally related to memory sub-systems, and more specifically, relate to faster multi-cell read operation using reverse read calibration.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

DETAILED DESCRIPTION

Figure 1A:
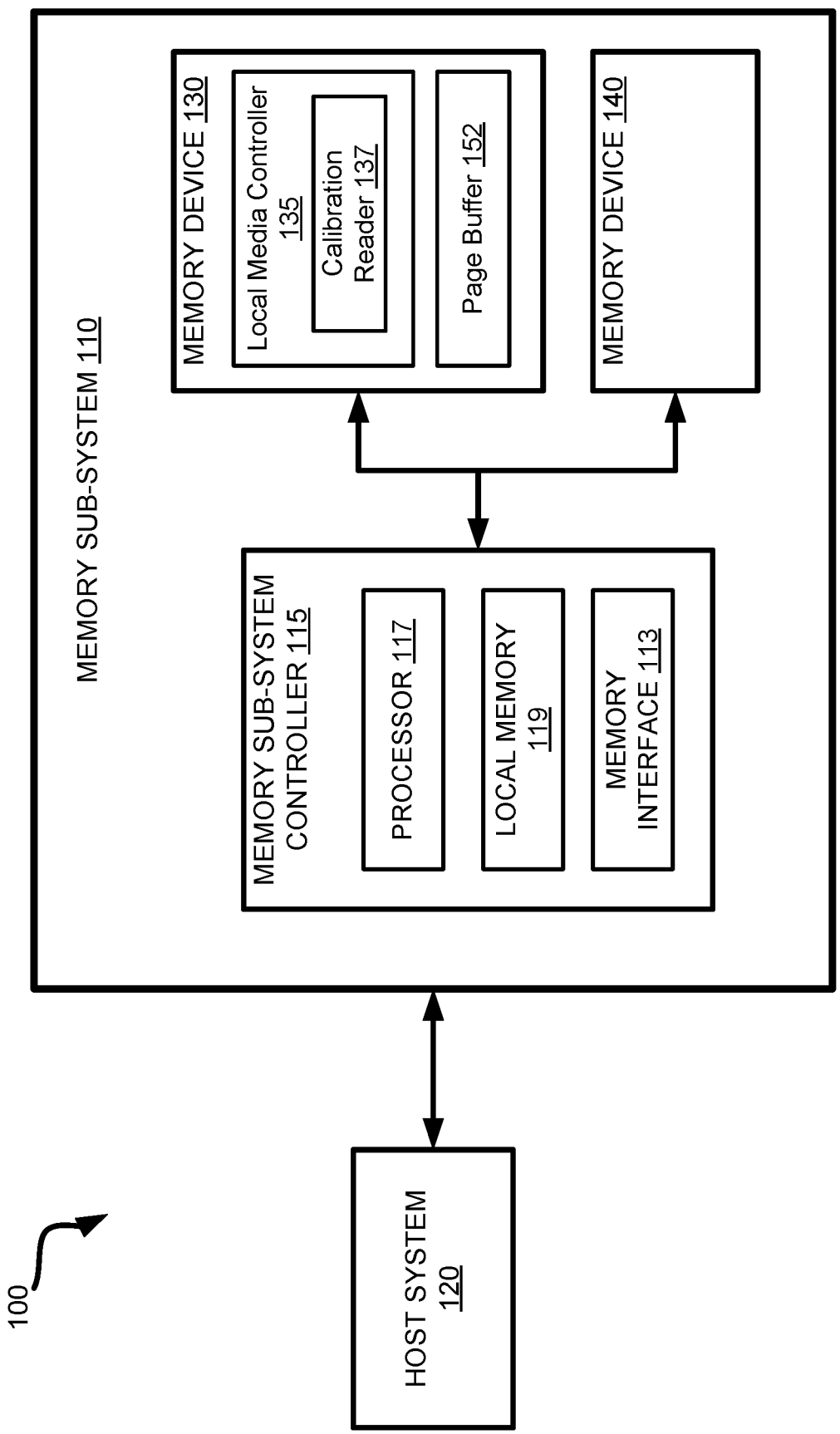
FIG. 1A illustrates an example computing system that includes a memory sub-system in accordance with some embodiments.

Embodiments of the present disclosure are directed to faster multi-cell read operation using reverse read calibration. One or more memory devices can be a part of a memory sub-system, which can be a storage device, a memory module, or a hybrid of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1A. A non-volatile memory device is a package of one or more dies. Each die can include two or more planes. For some types of non-volatile memory devices (e.g., NAND devices), each plane includes of a set of physical blocks. In some implementations, each block can include multiple sub-blocks. Each plane carries a matrix of memory cells formed onto a silicon wafer and joined by conductors referred to as wordlines and bitlines, such that a wordline joins multiple memory cells forming a row of the matrix of memory cells, while a bitline joins multiple memory cells forming a column of the matrix of memory cells.

Depending on the cell type, each memory cell can store one or more bits of binary information, and has various logic states that correlate to the number of bits being stored. The logic states can be represented by binary values, such as "0" and "1", or combinations of such values. A memory cell can be programmed (written to) by applying a certain voltage to the memory cell, which results in an electric charge being held by the memory cell, thus allowing modulation of the voltage distributions produced by the memory cell. A set of memory cells referred to as a memory page can be programmed together in a single operation, e.g., by selecting consecutive bitlines.

Precisely controlling the amount of the electric charge stored by the memory cell allows establishing multiple logical levels, thus effectively allowing a single memory cell to store multiple bits of information. A read operation can be performed by comparing the measured threshold voltages ($V_t$) exhibited by the memory cell to one or more reference voltage levels in order to distinguish between two logical levels for single-level cell (SLCs) and between multiple logical levels for multi-level cells. In various embodiments, a memory device can include multiple portions, including, e.g., one or more portions where the sub-blocks are configured as SLC memory and one or more portions where the sub-blocks are configured as multi-level cell (MLC) memory that can store three bits of information per cell and/or (triple-level cell) TLC memory that can store three bits of information per cell. The voltage levels of the memory cells in TLC memory form a set of 8 programming distributions representing the 8 different combinations of the three bits stored in each memory cell. Depending on how the memory cells are configured, each physical memory page in one of the sub-blocks can include multiple page types. For example, a physical memory page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical memory page formed from memory cells of the QLC memory type can have a total of four logical pages, where each logical page can store data distinct from the data stored in the other logical pages associated with that physical memory page, which is herein referred to as a "page."

A memory device typically experiences random workloads, which can impact the threshold voltage distributions, which can be shifted to higher or lower values. In order to compensate for various voltage distribution shifts, calibration operations can be performed in order to adjust the read level voltages. In certain memory devices, the adjustment can be performed based on values of one or more data state metrics obtained from a sequence of read and/or write operations. In an illustrative example, the data state metric can be represented by a raw bit error rate (RBER), which is the ratio of the number of erroneous bits to the number of all data bits stored in a certain portion of the memory device (e.g., in a specified data block). In these memory devices, sweep reads can be performed in order to create RBER/log likelihood ratio (LLR) profiles to error correction coding (ECC) and select the most efficient profile. However, these and other calibration techniques can exhibit pure accuracy and/or high latency. Furthermore, such techniques can be effectively "blind" with respect to the voltage distribution, which means that the threshold voltage estimate produced by such calibration techniques can gradually drift into the wrong voltage distribution valley, thus making the read data uncorrectable.

Additionally, some read voltage calibration operations adjust read level voltages, which are sequentially performed on memory cells of a page from a lowest threshold voltage distribution to a highest threshold voltage distribution. In order to avoid capacitive effects from both adjacent wordlines and a boosted voltage of unselected channels of three-dimensional (3D) NAND (e.g., vertical or V-NAND), sensing for the highest read level voltage can be performed first for a read operation. In certain devices, if a calibration to read level voltages is required based on the sensing operation, the wordline voltage is reduced so that read level voltages of respective threshold voltage distributions can be adjusted for read sensing, starting with a lowest threshold voltage distribution and moving to higher threshold voltage distributions, and ending with the highest threshold voltage distribution. This reduction in the wordline (WL) voltage to a read level voltage associated with the lowest threshold voltage distribution causes performance delays or latencies, e.g., due to the increase in read overhead time (tR) required to wait for the wordline voltage to settle down to a target read level voltage of the lowest threshold voltage distribution.

Aspects of the present disclosure address the above and other deficiencies through performing adjustments to read level voltages during a read calibration operation in a reverse order, namely, from a highest threshold voltage distribution to a lowest threshold voltage distribution. This reverse order allows the read level voltage adjustments to be made as the wordline voltage is reduced over time, e.g., while performing the read calibration operation. More specifically, in one embodiment, control logic of the NAND determines, based on a charge loss characteristic of a highest threshold voltage distribution, whether a charge loss of a subset of multiple memory cells satisfies a threshold voltage drop criterion. Satisfying the threshold voltage drop criterion can be understood as at least reaching a threshold change in voltage corresponding to a threshold charge loss (or temporal voltage shift).

In at least one embodiment, in response to the charge loss of a subset of a group memory cells not satisfying the threshold voltage drop criterion, the control logic determines that no adjustment is needed to the read level voltage for the highest threshold voltage distribution, e.g., by a target read level voltage becoming a reference read level voltage. In this embodiment, the control logic determines a metadata value characterizing a first read level voltage of the highest threshold voltage distribution of the subset of the group of memory cells, where the metadata value is at least one of a failed byte count (CFByte) or a failed bit count (CFBit). The failed byte count reflects (e.g., is equal to or is derived by a known transformation from) the number of bytes in the sensed data that have at least one non-conducting bitline. The failed bit count reflects (e.g., is equal to or is derived by a known transformation from) the number of non-conducting bitlines in the sensed data. In various implementations, the memory device can inspect four or eight bitlines in a byte when counting non-conducting bitlines.

In the at least one embodiment, the control logic further adjusts, based on the metadata value, a second read level voltage for a second-highest threshold voltage distribution of the subset of the group of memory cells. The control logic then, in this embodiment and to perform an initial calibrated read of the subset of the plurality of memory cells, causes the adjusted second read level voltage to be applied to a wordline of the plurality of wordlines to read the second-highest threshold voltage distribution. These updates to the read level voltages can continue to be performed sequentially to additional lower threshold voltage distributions of the group of memory cells, e.g., the third-highest threshold voltage distribution and the fourth-highest threshold voltage distribution.

In at least one embodiment, in response to the charge loss of the subset satisfying the threshold voltage drop criterion, the control logic begins the read calibration operation with a calibrated update also to the read level voltage of the highest threshold distribution. In this embodiment, the control logic first adjusts, based on the metadata value, the first read level voltage, and then causes the adjusted first read level voltage to be applied to a wordline of the memory array to read the highest threshold voltage distribution, e.g., to perform an initial calibrated read of the subset of the group of memory cells. These operations can be performed before moving to update and apply the second read level voltage to the second-highest threshold voltage distribution, and so forth, to the third-highest threshold voltage distribution, the fourth-highest threshold voltage distribution, and so on in subsequent calibrated reads.

Therefore, advantages of the systems and methods implemented in accordance with some embodiments of the present disclosure include, but are not limited to, improving the read overhead time (tR) by reducing the latency or delays associated with performing a read calibration operation. Other advantages will be apparent to those skilled in the art of read performance optimization in operating programmable memory devices, which will be discussed hereinafter.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. The host system 120 can provide data to be stored at the memory sub-system 110 and can request data to be retrieved from the memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple-level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage a memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In at least one embodiment, memory device 130 includes a memory access manager configured to carry out memory access operations, e.g., in response to receiving memory access commands from memory interface 113. In some implementations, local media controller 135 includes at least a portion of memory access manager and is configured to perform the functionality described herein. In some implementations, the memory access manager is implemented on memory device 130 using firmware, hardware components, or a combination of the above. In an illustrative example, the memory access manager receives, from a requestor, such as memory interface 113, a request to read a data page of the memory device 130. A read operation can include a series of read strobes, such that each strobe applied a certain read level voltage to a chosen wordline of a memory device 130 in order to compare the estimated threshold voltages $V_T$ of a set of memory cells to one or more read levels corresponding to the expected positions of the voltage distributions of the memory cells.

In some embodiments, the memory device 130 includes a page buffer 152, which can provide the circuitry used to program data to the memory cells of the memory device 130 and to read the data out of the memory cells. In some embodiments, control logic of the local media controller 135 includes a calibration reader 137 that can implement or direct the read operations that include reverse read calibration and other related operations herein. In some embodiments, this control logic is integrated in whole or in part within the memory sub-system controller 115 and/or the host system 120.

Figure 1B:
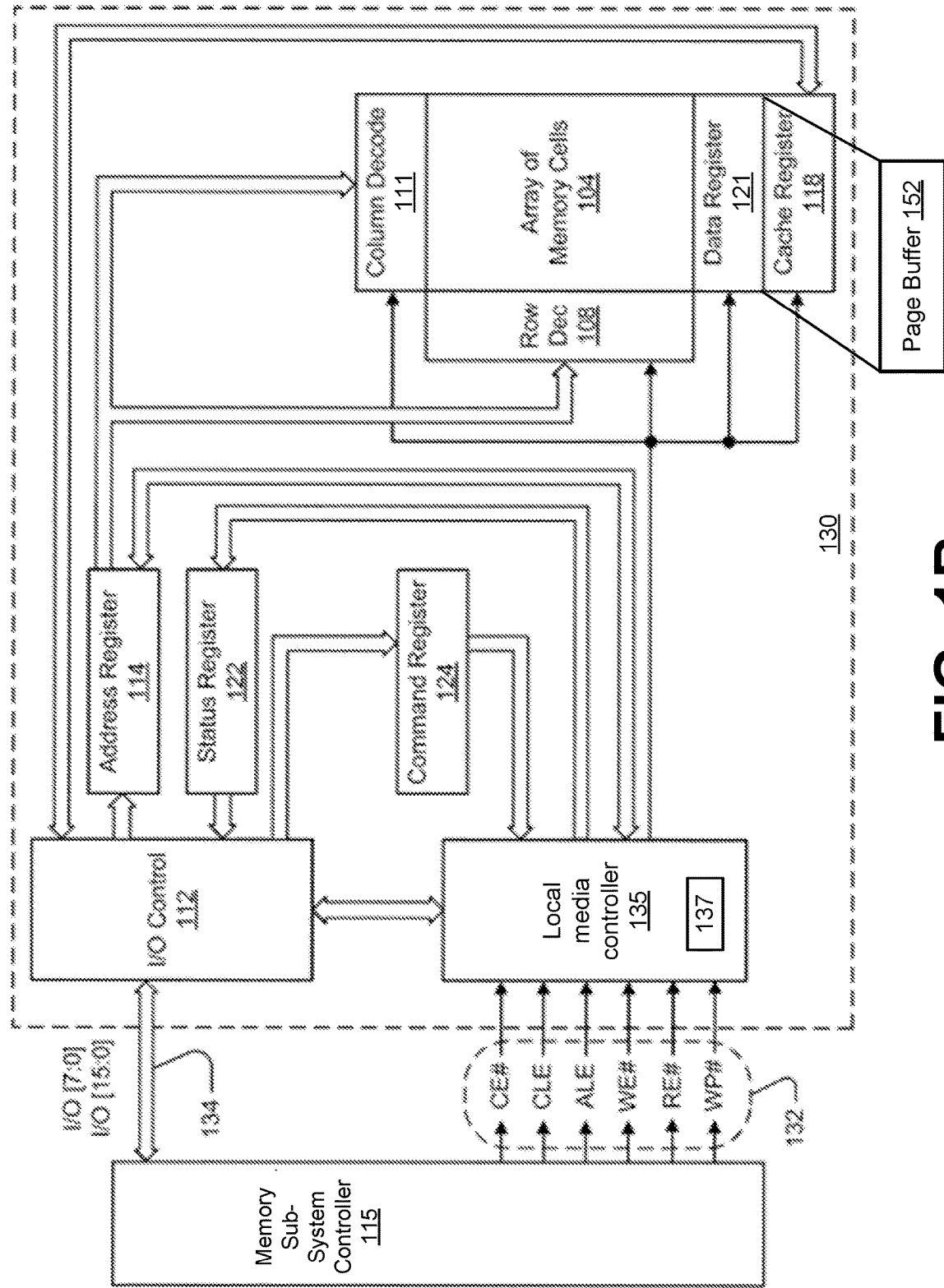
FIG. 1B is a block diagram of a memory device in communication with a memory sub-system controller of a memory sub-system according to an embodiment.

FIG. 1B is a simplified block diagram of a first apparatus, in the form of a memory device 130, in communication with a second apparatus, in the form of a memory sub-system controller 115 of a memory sub-system (e.g., the memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), can be a memory controller or other external host device.

The memory device 130 includes an array of memory cells 104 logically arranged in rows and columns. Memory cells of a logical row are typically connected to the same access line (e.g., a word line) while memory cells of a logical column are typically selectively connected to the same data line (e.g., a bit line). A single access line can be associated with more than one logical row of memory cells and a single data line can be associated with more than one logical column. Memory cells (not shown in FIG. 1B) of at least a portion of the array of memory cells 104 are capable of being programmed to one of at least two target data states.

Row decode circuitry 108 and column decode circuitry 111 are provided to decode address signals. Address signals are received and decoded to access the array of memory cells 104. The memory device 130 also includes input/output (I/O) control circuitry 112 to manage input of commands, addresses and data to the memory device 130 as well as output of data and status information from the memory device 130. An address register 114 is in communication with the I/O control circuitry 112 and row decode circuitry 108 and column decode circuitry 111 to latch the address signals prior to decoding. A command register 124 is in communication with the I/O control circuitry 112 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 111 to control the row decode circuitry 108 and column decode circuitry 111 in response to the addresses.

The local media controller 135 is also in communication with a cache register 118 and a data register 121. The cache register 118 latches data, either incoming or outgoing, as directed by the local media controller 135 to temporarily store data while the array of memory cells 104 is busy writing or reading, respectively, other data. During a program operation (e.g., write operation), data can be passed from the cache register 118 to the data register 121 for transfer to the array of memory cells 104; then new data can be latched in the cache register 118 from the I/O control circuitry 112. During a read operation, data can be passed from the cache register 118 to the I/O control circuitry 112 for output to the memory sub-system controller 115; then new data can be passed from the data register 121 to the cache register 118. The cache register 118 and/or the data register 121 can form (e.g., can form at least a portion of) the page buffer 152 of the memory device 130. The page buffer 152 can further include sensing devices such as a sense amplifier, to sense a data state of a memory cell of the array of memory cells 104, e.g., by sensing a state of a data line connected to that memory cell. A status register 122 can be in communication with I/O control circuitry 112 and the local memory controller 135 to latch the status information for output to the memory sub-system controller 115.

The memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) can be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands can be received over input/output (I/O) pins [7:0] of I/O bus 134 at I/O control circuitry 112 and can then be written into a command register 124. The addresses can be received over input/output (I/O) pins [7:0] of I/O bus 134 at I/O control circuitry 112 and can then be written into address register 114. The data can be received over input/output (I/O) pins [7:0] for an 8-bit device or input/output (I/O) pins [15:0] for a 16-bit device at I/O control circuitry 112 and then can be written into cache register 118. The data can be subsequently written into data register 121 for programming the array of memory cells 104.

In an embodiment, cache register 118 can be omitted, and the data can be written directly into data register 121. Data can also be output over input/output (I/O) pins [7:0] for an 8-bit device or input/output (I/O) pins [15:0] for a 16-bit device. Although reference can be made to I/O pins, they can include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) can be used in the various embodiments.

Figure 2A:
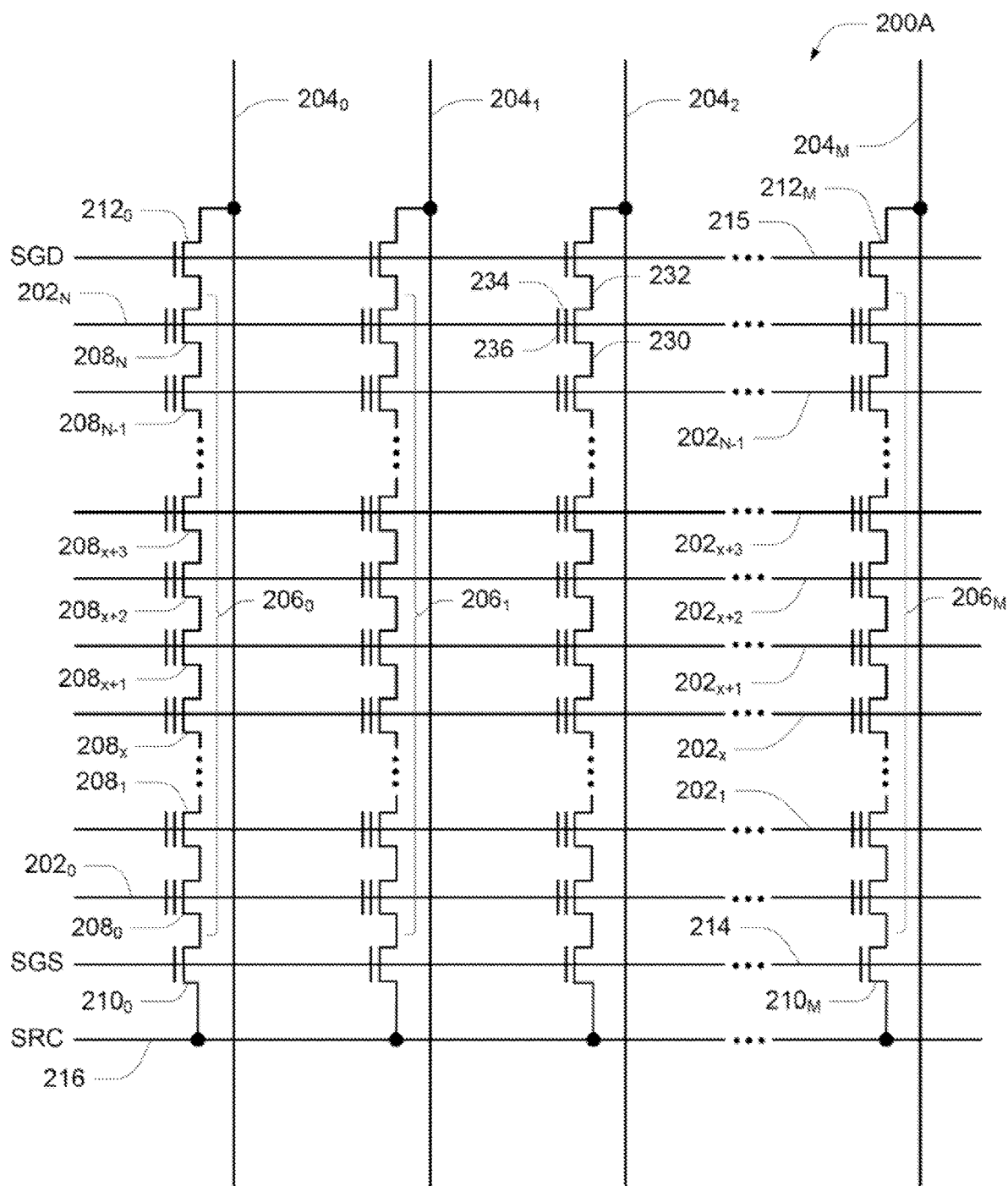
FIG. 2A-2B are schematics of portions of an array of memory cells as could be used in a memory of the type described with reference to FIG. 1B according to an embodiment.
Figure 2B:
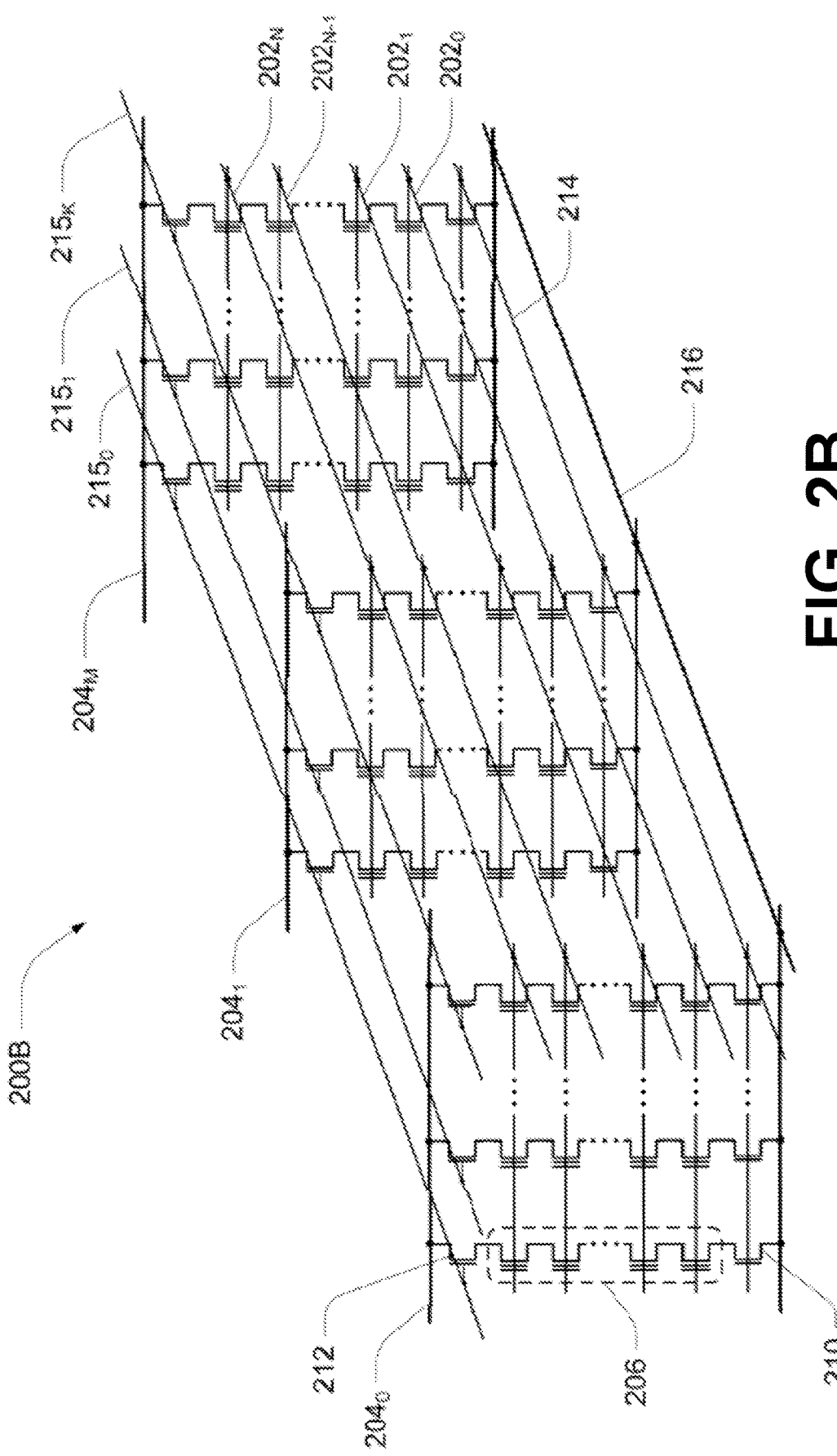

FIG. 2A-2B are schematics of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as word lines $202_0$ to $202_N$, and data lines, such as bit lines $204_0$ to $204_M$. The word lines 202 can be connected to global access lines (e.g., global word lines), not shown in FIG. 2A, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well.

Memory array 200A can be arranged in rows (each corresponding to a word line 202) and columns (each corresponding to a bit line 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

The memory array 200A in FIG. 2A can be a quasi-two-dimensional memory array and can have a generally planar structure, e.g., where the common source 216, NAND strings 206 and bit lines 204 extend in substantially parallel planes. Alternatively, the memory array 200A in FIG. 2A can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2A. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a word line 202.

A column of the memory cells 208 can be a NAND string 206 or a number of NAND strings 206 selectively connected to a given bit line 204. A row of the memory cells 208 can be memory cells 208 commonly connected to a given word line 202. A row of memory cells 208 can, but need not, include all the memory cells 208 commonly connected to a given word line 202. Rows of the memory cells 208 can often be divided into one or more groups of physical pages of memory cells 208, and physical pages of the memory cells 208 often include every other memory cell 208 commonly connected to a given word line 202. For example, the memory cells 208 commonly connected to word line $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to word line $202_N$ and selectively connected to odd bit lines 204 (e.g., bit lines $204_1$, $204_3$, $204_5$, etc.) can be another physical page of the memory cells 208 (e.g., odd memory cells).

Although bit lines $204_3$-$204_5$ are not explicitly depicted in FIG. 2A, it is apparent from the figure that the bit lines 204 of the array of memory cells 200A can be numbered consecutively from bit line $204_0$ to bit line $204_M$. Other groupings of the memory cells 208 commonly connected to a given word line 202 can also define a physical page of memory cells 208. For certain memory devices, all memory cells commonly connected to a given word line can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells. Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 2B is another schematic of a portion of an array of memory cells 200B as could be used in a memory of the type described with reference to FIG. 1B, e.g., as a portion of the array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B can incorporate vertical structures which can include semiconductor pillars where a portion of a pillar can act as a channel region of the memory cells of NAND strings 206. The NAND strings 206 can be each selectively connected to a bit line $204_0$-$204_M$ by a select transistor 212 (e.g., that can be drain select transistors, commonly referred to as select gate drain) and to a common source 216 by a select transistor 210 (e.g., that can be source select transistors, commonly referred to as select gate source). Multiple NAND strings 206 can be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. In some embodiments, each sub-block or string of memory cells has a separate select line 214 from other sub-blocks or strings. In some embodiments, a pair of sub-blocks shares a select line 214. Each word line 202 can be connected to multiple rows of memory cells of the memory array 200B. Rows of memory cells that are commonly connected to each other by a particular word line 202 can collectively be referred to as tiers.

Figure 3:
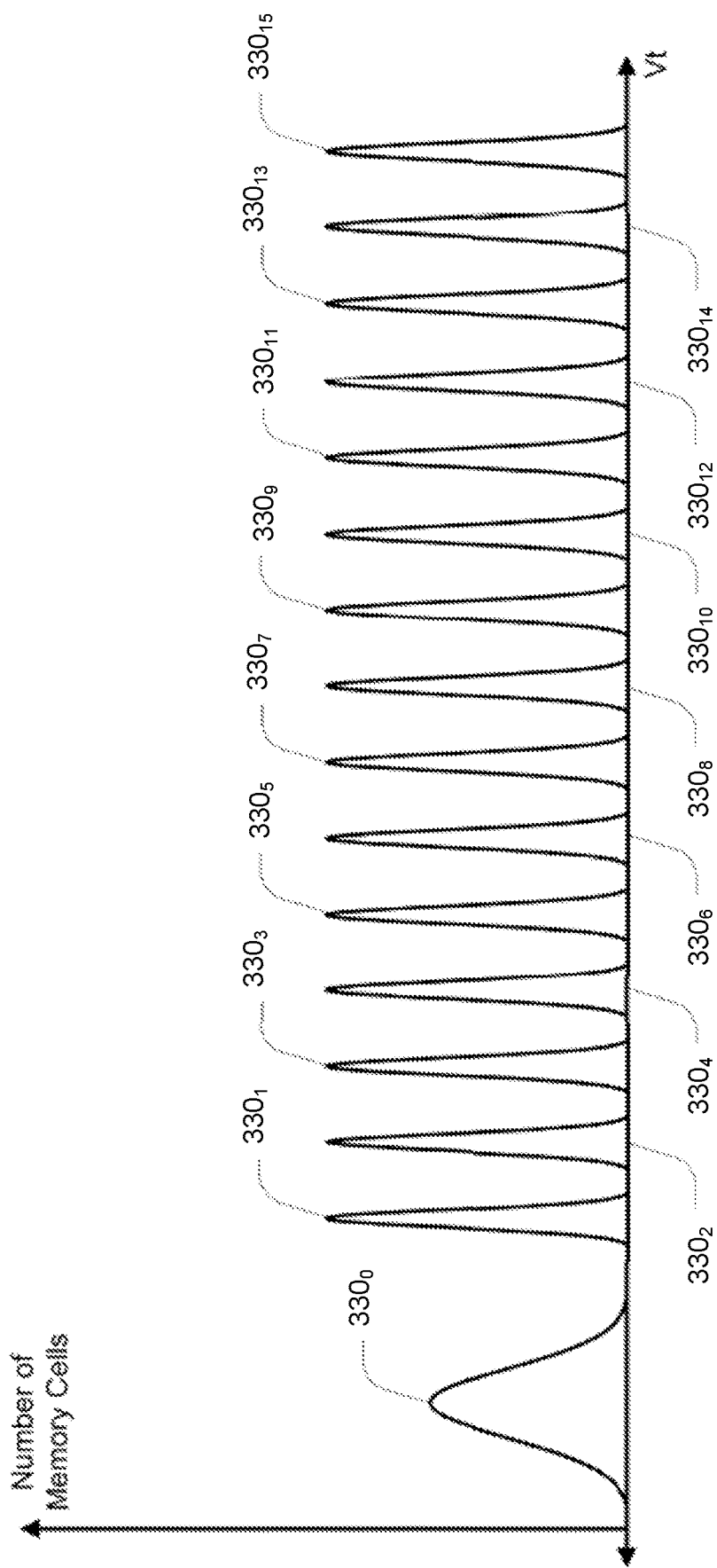
FIG. 3 is a conceptual depiction of threshold voltage distributions of multiple memory cells of a memory array according to an embodiment.

FIG. 3 is a conceptual depiction of threshold voltage ranges of multiple memory cells. FIG. 3 illustrates an example of threshold voltage ranges and their distributions for a population of a sixteen-level memory cells, e.g., QLC memory cells. For example, such a memory cell can be programmed to a threshold voltage ($V_t$) that falls within one of sixteen different threshold voltage ranges $330_0$-$330_{15}$, each being used to represent a data state corresponding to a bit pattern of four bits. The threshold voltage range $330_0$ typically has a greater width than the remaining threshold voltage ranges $330_1$-$330_{15}$ as memory cells are generally all placed in the data state corresponding to the threshold voltage range $330_0$, then subsets of those memory cells are subsequently programmed to have threshold voltages in one of the threshold voltage ranges $330_1$-$330_{15}$. As programming operations are generally more incrementally controlled than erase operations, these threshold voltage ranges $330_1$-$330_{15}$ can tend to have tighter distributions.

TABLE 1

| Data State | Logical Data Value | Data State | Logical Data Value |
|---|---|---|---|
| L0 | 1111 | L8 | 1100 |
| L1 | 0111 | L9 | 0100 |
| L2 | 0011 | L10 | 0000 |
| L3 | 1011 | L11 | 1000 |
| L4 | 1001 | L12 | 1010 |
| L5 | 0001 | L13 | 0010 |
| L6 | 0101 | L14 | 0110 |
| L7 | 1101 | L15 | 1110 |

The threshold voltage ranges $330_0$, $330_1$, $330_2$, $330_3$, $330_4$, $330_5$, $330_6$, $330_7$, $330_8$, $330_9$, $330_{10}$, $330_{11}$, $330_{12}$, $330_{13}$, $330_{14}$, and $330_{15}$ can each represent a respective data state, e.g., L0, L1, L2, L3, L4, L5, L6, L7, L8, L9, L10, L11, L12, L13, L14 and L15, respectively. As an example, if the threshold voltage of a memory cell is within the first of the sixteen threshold voltage ranges $330_0$, the memory cell in this case can be storing a data state L0 having a data value of logical '1111' and is typically referred to as the erased state of the memory cell. If the threshold voltage is within the second of the sixteen threshold voltage ranges $330_1$, the memory cell in this case can be storing a data state L1 having a data value of logical '0111'. If the threshold voltage is within the third of the sixteen threshold voltage ranges $330_2$, the memory cell in this case can be storing a data state L2 having a data value of logical '0011,' and so on. Table 1 provides one possible correspondence between the data states and their corresponding logical data values. Other assignments of data states to logical data values are known or can be envisioned. Memory cells remaining in the lowest data state (e.g., the erased state or L0 data state), as used herein, will be deemed to be programmed to the lowest data state.

Figure 4:
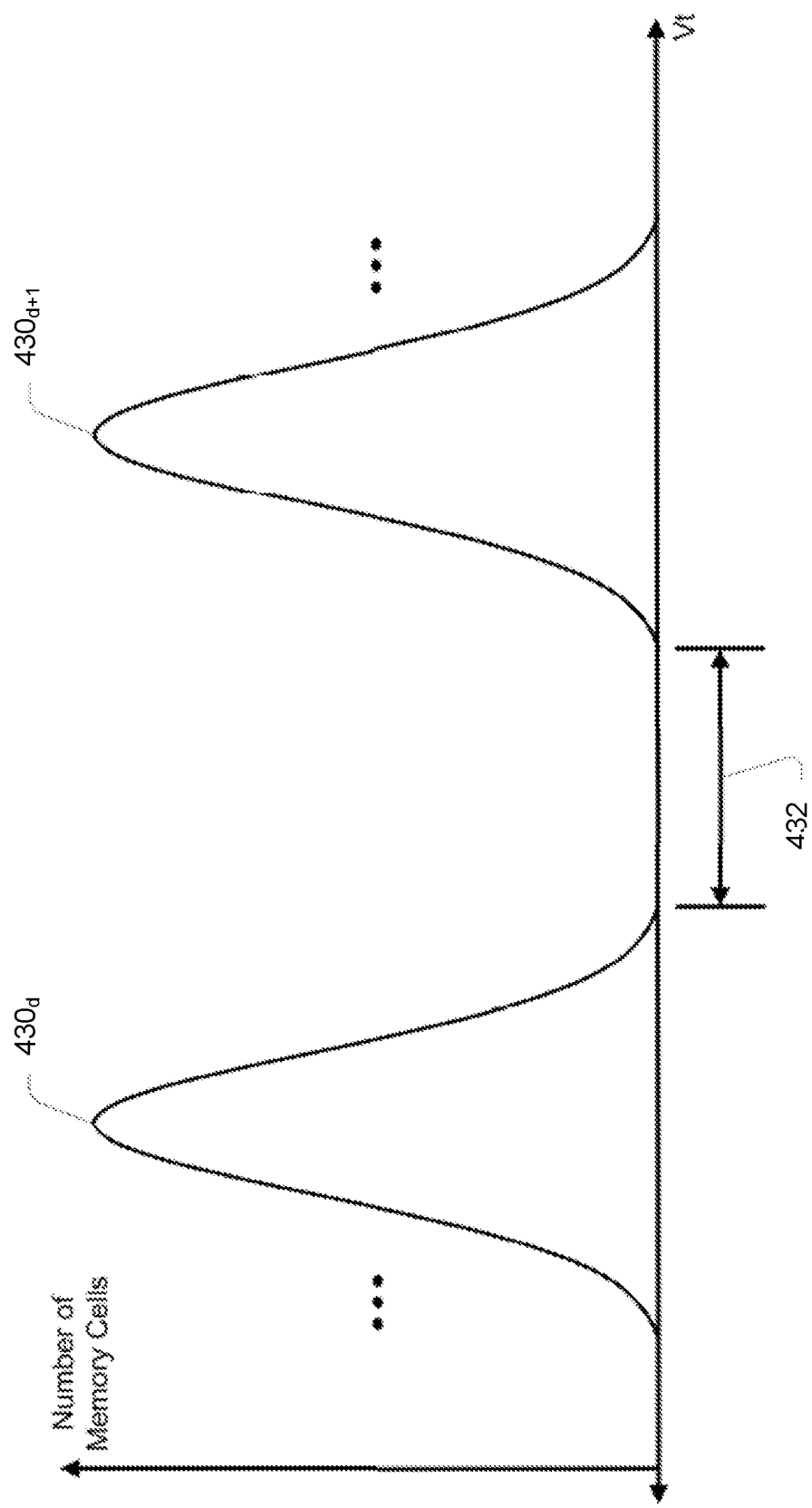
FIG. 4 is a conceptual depiction of a threshold voltage distribution of multiple memory cells at one stage following programming for use with various embodiments.

FIG. 4 is a conceptual depiction of a threshold voltage distribution of multiple memory cells following a programming operation. The threshold voltage distributions $430_d$-$430_{d+1}$ of FIG. 4 can represent some portion of the distributions for threshold voltage ranges $330_0$-$330_{15}$ of FIG. 3 at the completion of a programming operation for memory cells. With reference to FIG. 4, adjacent threshold voltage distributions 430 are typically separated by some margin 432 (e.g., dead space) at the completion of programming. Applying a sense voltage (e.g., read level voltage) within the margin 432 to the control gates of the multiple memory cells can be used to distinguish between the memory cells of the threshold voltage distribution $430_d$ (and any lower threshold voltage distribution) and the memory cells of the threshold voltage distribution $430_{d-1}$ (and any higher threshold voltage distribution).

Figure 10:
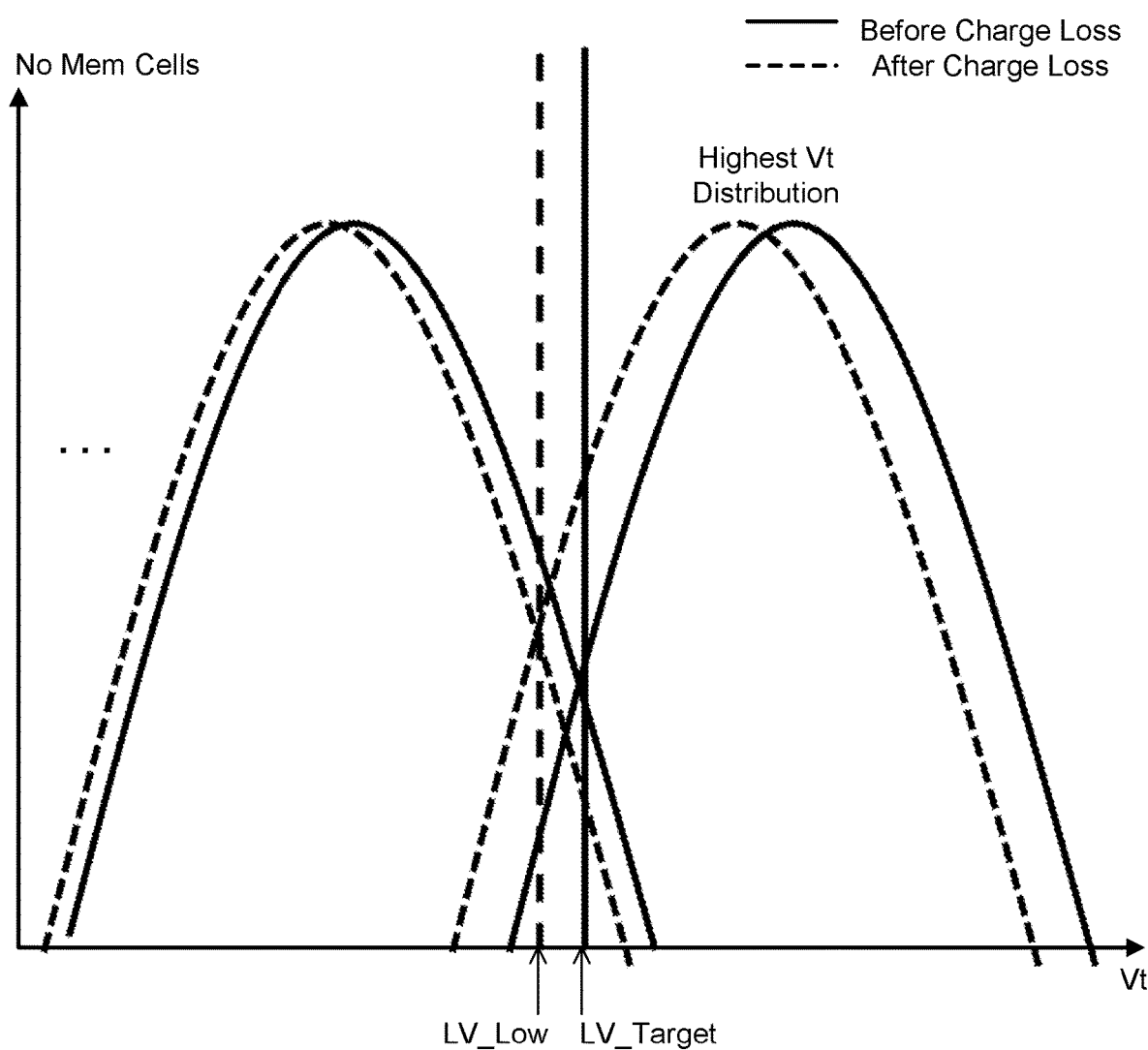
FIG. 10 is a graph of a number of memory cells versus threshold voltage distribution illustrating waveforms before and after charge loss and identifying a target read level voltage and a low read level voltage that is lower than the target read level voltage according to an embodiment.

Due to the phenomenon known as slow charge loss, the threshold voltage of a memory cell changes in time as the electric charge of the cell is degrading, which is referred to as "temporal voltage shift" (since the degrading electric charge causes the voltage distributions to shift along the voltage axis towards lower voltage levels). The threshold voltage is changing rapidly at first (immediately after the memory cell was programmed), and then slows down in an approximately logarithmic linear fashion with respect to the time elapsed since the cell programming event. This temporal voltage shift, if left unadjusted, reduces the margin 432 between the threshold voltage distributions $430_d$-$430_{d-1}$ over time, and can cause these threshold voltage distributions to overlap, as illustrated in FIG. 10, making it more difficult to distinguish between adjacent threshold voltage distributions. Accordingly, failure to mitigate the temporal voltage shift caused by the slow charge loss can result in the increased bit error rate in read operations, which the fast read calibration described herein is intended to mitigate.

Figure 5A:
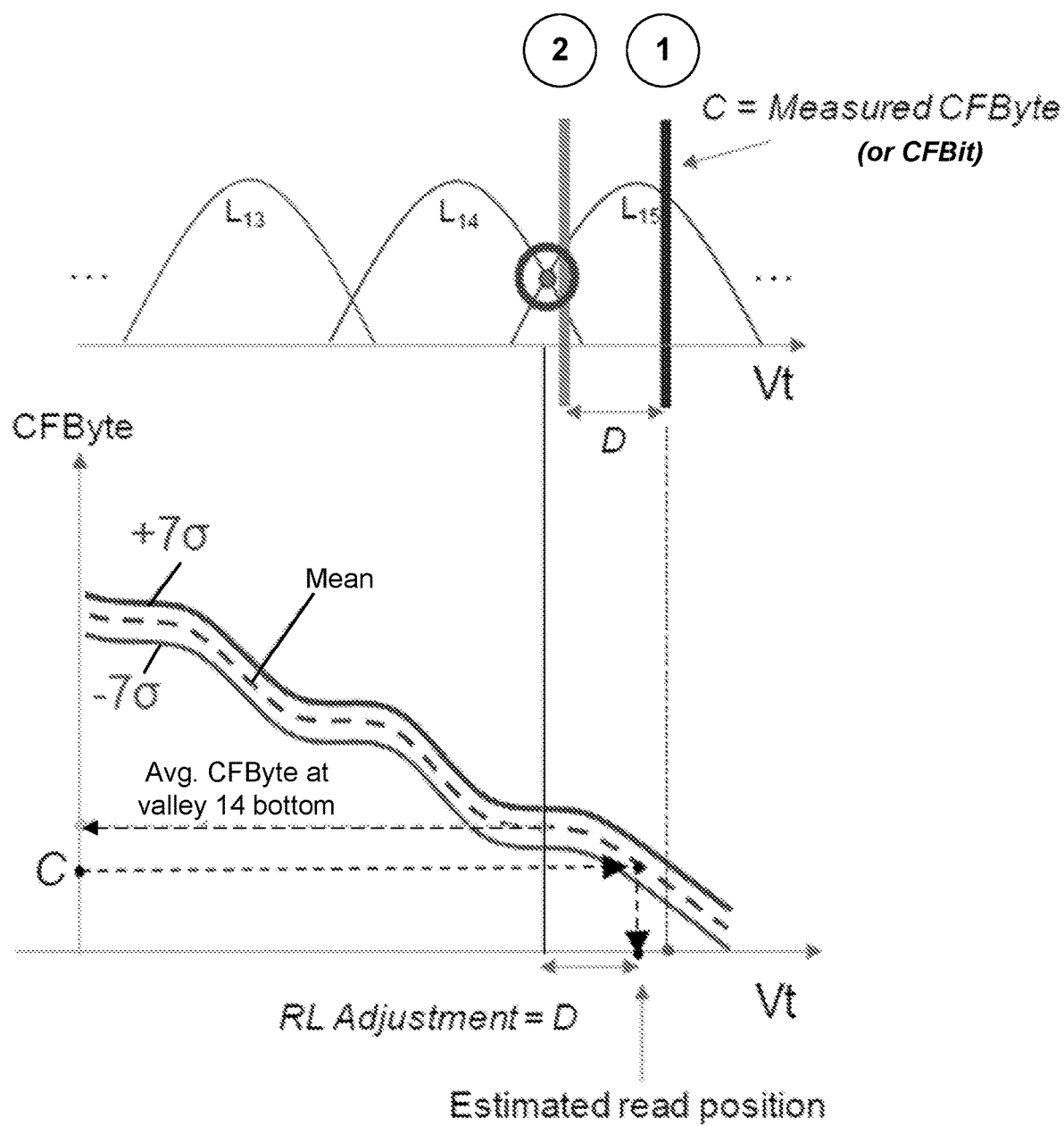
FIG. 5A is a set of graphs illustrating an example of a read calibration based on a metadata value according to at least one embodiment.

FIG. 5A is a set of graphs illustrating an example of a read calibration based on a metadata value according to at least one embodiment. In some embodiments, the calibration reader 137 utilizes memory device-originated metadata that characterizes voltage distributions for adjusting read level voltages. More specifically, in various embodiments, the temporal voltage shift discussed above can be selectively tracked for programmed pages or blocks grouped by time after program (TAP). In some embodiments, the temporal voltage shift provides an initial estimate of a charge loss characteristic. In at least some embodiments, the calibration reader 137 causes a dual-strobe sensing operation be performed directed at a highest read level voltage of a subset of a group of memory cells, which is discussed in more detail with reference to FIGS. 9-11B.

In these embodiments, the dual-strobe sensing operation can estimate a charge loss between a target read level (LV_target) and a low read level voltage (LV_low) using such a charge loss characteristic. The calibration reader 137 can also measure the metadata value (whether CFByte or CFBit) using the first read strobe of the dual-strobe sensing operation, e.g., at the LV_target, and estimate, based on an average metadata value across the memory cells of the measured highest threshold voltage distribution, a read level voltage offset (illustrated as "D"). Accordingly, the memory device 130 can, in response to a read strobe, return one or more metadata values to the calibration reader 137.

In an illustrative example, the memory device 130 can, upon performing the read strobe, return the failed byte count (CFByte). The failed byte count reflects (e.g., is equal to or is derived by a known transformation from) the number of bytes in the sensed data that have at least one non-conducting bitline. Given the use of a data scrambler of the memory device 130, the CFByte value at a given read threshold voltage can have a strong correlation to the minimum valley location, as illustrated in FIG. 5A. In another illustrative example, the memory device can, upon performing a read strobe, return the failed bit count (CFBit). The failed bit count reflects (i.e., is equal to or is derived by a known transformation from) the number of non-conducting bitlines in the sensed data. In various embodiments, the memory device can inspect four or eight bitlines in a byte when counting non-conducting bitlines.

The metadata values received from the memory device 130 in response to a read strobe can be used by the memory sub-system controller 115 or by control logic of the local media controller 135 (e.g., by the calibration reader 137) to adjust the applied read level voltages in order to compensate for the voltage distribution shift. In some embodiments, the control logic utilizes one or more returned metadata values to index within a lookup table that maps memory device-originated metadata values (e.g., failed byte counts or failed bit counts) to the read voltage adjustment values (e.g., read voltage offsets). Then, the control logic can utilize the determined read voltage offset to adjust the read level voltage for performing the next read strobe in a sensing or read operation. In at least some embodiments, the control logic determines an estimated read position based on an average CFByte (or CFBit) at the valley 14 bottom (e.g., r14), and reduces the read level voltage for valley 14 by the read voltage offset within QLC-based memory. While QLC-based memory cells are used as exemplary, the principles and present disclosure equally apply to other multi-level memory cells.

Figure 5B:
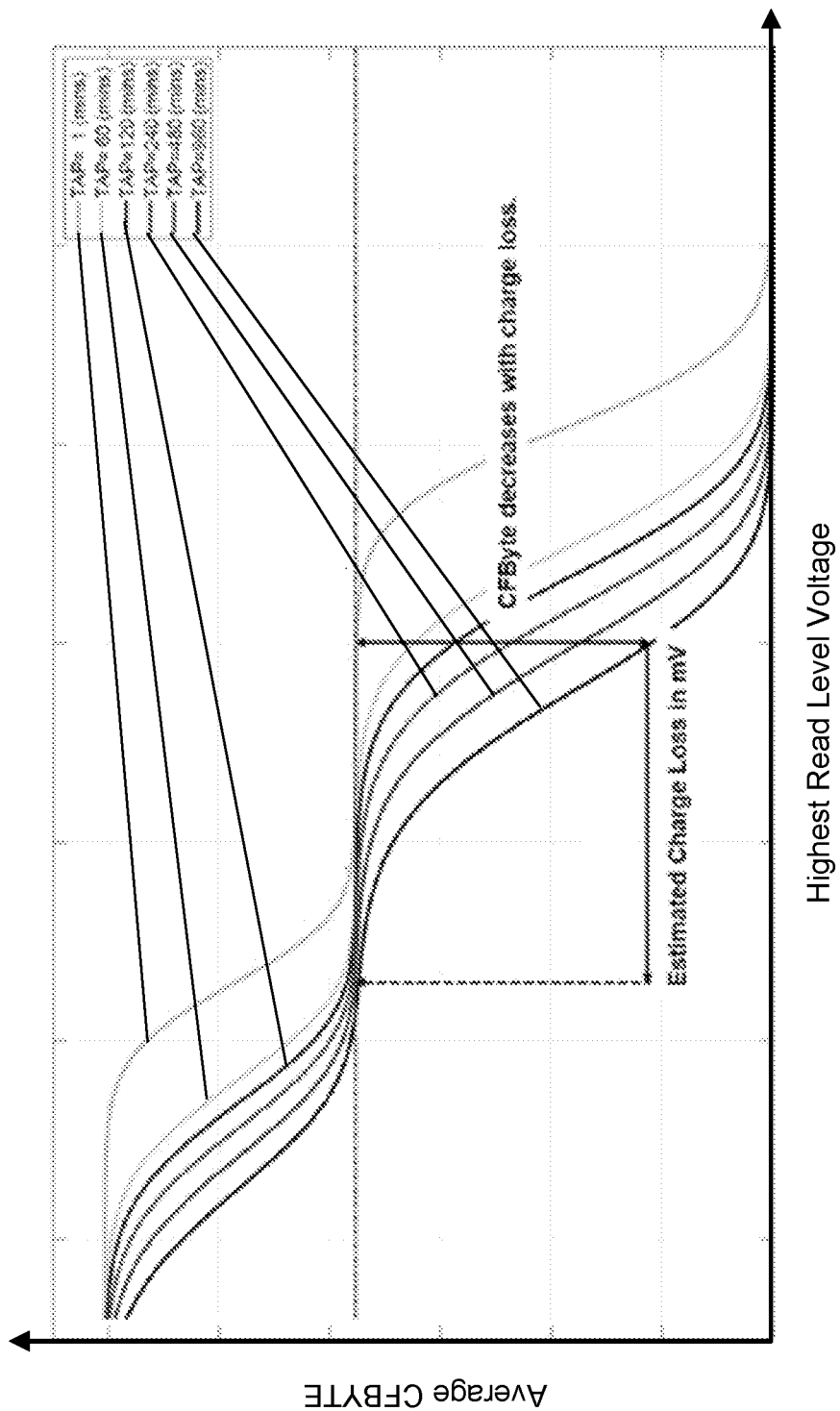
FIG. 5B is a graph illustrating an example highest read level voltage change compared to an average failed count byte (CFByte) for different time after program (TAP) time periods according to at least one embodiment.

FIG. 5B is a graph illustrating an example highest read level voltage change compared to an average failed count byte (CFByte) for different time after program (TAP) time periods according to at least one embodiment. As can be seen, the highest read level voltage is the fifteenth read level voltage (r15) of QLC-based memory cells, which may incur about 350 mV of charge loss within a minute of TAP and that CFByte (CFBit) generally decreases with charge loss as the TAP proceeds to 60, 120, 240, 480, and 960 minutes, for example.

Figure 5C:
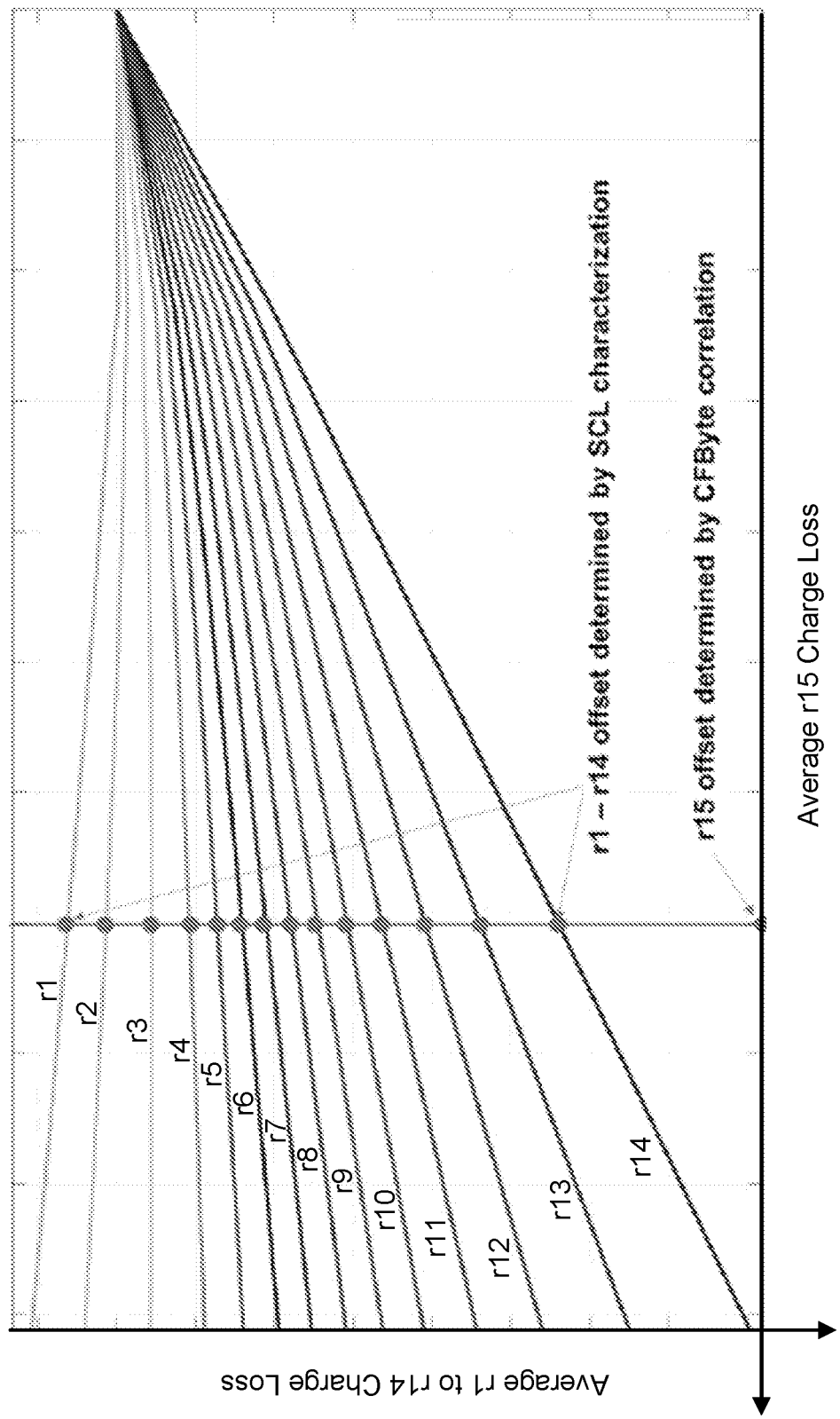
FIG. 5C is a graph illustrating an average charge loss of a highest read level voltage compared to an average charge loss for a number of lower read level voltages according to at least one embodiment.

FIG. 5C is a graph illustrating an average charge loss of a highest read level voltage compared to an average charge loss for a number of lower read level voltages according to at least one embodiment. The highest read level voltage may be the fifteenth read level voltage (r15) and the average charge loss is greatest for higher read level voltages (e.g., r9-r14) and smallest for the lower read level voltages (e.g., r1-r8).

In various embodiments, the control logic determines a read voltage offset of the highest read level voltage (r15) by a metadata value (e.g., CFByte or CFBit value) correlation and determines other read voltage offsets of the other lower read level voltages (e.g., r1 through r14) via SCL characterization. In these embodiments, the metadata value can be determined via a first read strobe (of the dual-strobe sensing operation) that senses a target read level voltage (LV_target).

In these embodiments, the control logic can then use the metadata value (e.g., CFByte/CFBit value) to determine a Charge Loss Bucket Classifier (CBC) value that may be used to index within the lookup table that was previously referenced. The CBC value can then return a series of wordline (WL) voltage offsets that the control logic can cause to be applied to the read level voltage for sensing operation of corresponding threshold voltage distributions for a given page of data. For example, for a lower page (LP) of data of QLC-based memory cells, the page of data can include the L11, L6, L4, and L1 threshold voltage distributions. Further, for an upper page (UP) of data, the page of data can include the L13, L9, L7, and L3 threshold voltage distributions. Further, for an extra page (XP) of data, the page of data can include the L14, L8, and L2 threshold voltage distributions. Finally, for a top page (TP) of data, the page of data can include the L15, L12, L10, and L5 threshold voltage distributions.

By way of example, an exemplary lookup table for the TP is illustrated in Table 2. The lookup tables for each of the LP, UP, and XP may be similar, but index to different read voltage offsets for different threshold voltage distributions, which were referenced above. The calibration reader 137 (or other control logic of the local media controller 135) can access these lookup tables within local memory to the memory device 130, which may also be loaded into a type of cache for fast access. As discussed, each of the different read voltage offsets may be determined via device-originated metadata that characterizes voltage distributions with corresponding read voltage offsets, e.g., by employing information such as that illustrated in FIGS. 5A-5B.

TABLE 2

| L15 Metadata Value | CBC | Offset LV15 | Offset LV12 | Offset LV10 | Offset LV5 |
|---|---|---|---|---|---|
| Value_0 | 0 | Offset_0 | Offset_0 | Offset_0 | Offset_0 |
| Value_1 | 1 | Offset_1 | Offset_1 | Offset_1 | Offset_1 |
| Value_2 | 2 | Offset_2 | Offset_2 | Offset_2 | Offset_2 |
| Value_3 | 3 | Offset_3 | Offset_3 | Offset_3 | Offset_3 |
| Value_4 | 4 | Offset_4 | Offset_4 | Offset_4 | Offset_4 |
| Value_5 | 5 | Offset_5 | Offset_5 | Offset_5 | Offset_5 |
| Value_6 | 6 | Offset_6 | Offset_6 | Offset_6 | Offset_6 |
| Value_7 | 7 | Offset_7 | Offset_7 | Offset_7 | Offset_7 |

Figure 6:
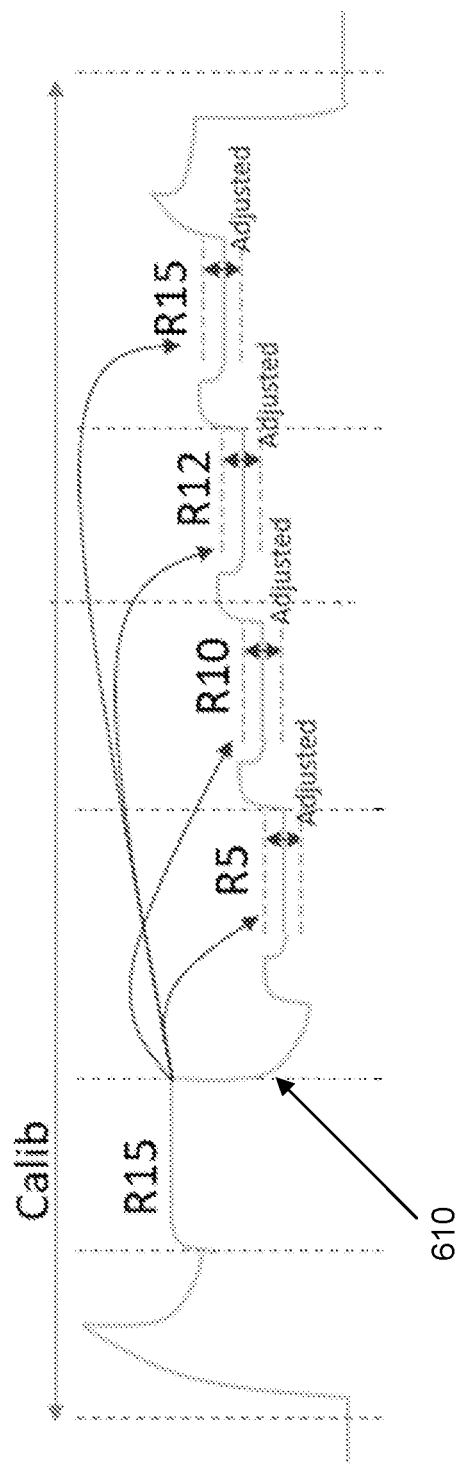
FIG. 6 is a graph depicting an example read calibration operation in which read level voltage adjustments are sequentially performed on memory cells of a page from a lowest threshold voltage distribution to a highest threshold voltage distribution according to an embodiment.

FIG. 6 is a graph depicting an example read calibration operation in which read level voltage adjustments are sequentially performed on memory cells of a page from a lowest threshold voltage distribution to a highest threshold voltage distribution according to an embodiment. In this example, the read level voltage adjustments are made sequentially to the read level voltages R5, R10, R12, and R15 that read the L5, L10, L12, and L15 threshold voltage distributions, respectively. As can be observed, the WL voltage requires a significant voltage drop 610 before beginning with a read calibration at the R5 read level voltage, which is the lowest of the subset of memory cells of the top page (TP) of a set of QLC-based memory cells. Adjustments to additional read level voltages are performed in sequential order of increasingly greater threshold voltage distributions, e.g., L10, L12, L15. As discussed, this reduction in the WL voltage to a read level voltage associated with the lowest threshold voltage distribution causes performance delays or latencies, e.g., due to the increase in read overhead time (tR) required to wait for the WL voltage to settle down to a target read level voltage for R5.

Figure 7A:
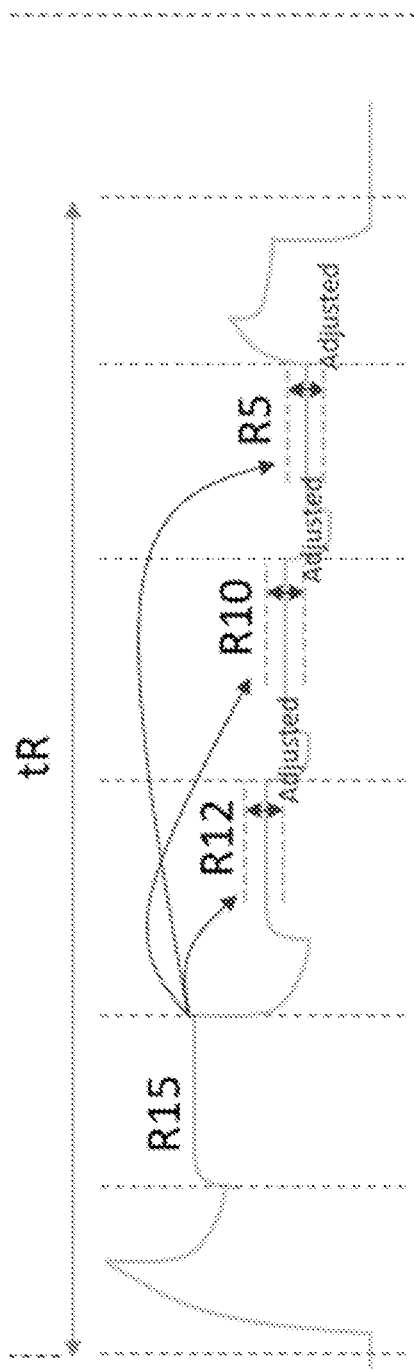
FIG. 7A is a graph depicting an example read calibration operation in which read level voltage adjustments are sequentially performed on memory cells of a page from a second-highest threshold voltage distribution to a lowest threshold voltage distribution according to an embodiment.

FIG. 7A is a graph depicting an example read calibration operation in which read level voltage adjustments are sequentially performed on memory cells of a page from a second-highest threshold voltage distribution to a lowest threshold voltage distribution according to an embodiment. In at least one embodiment, if the charge loss of the subset of memory cells (e.g., for the TP) does not satisfy the threshold voltage drop criterion, then the R15 read level voltage for the highest voltage distribution (L15) need not be adjusted or further sensed. Satisfying the threshold voltage drop criterion can be understood as at least meeting a threshold change in voltage corresponding to a threshold charge loss or temporal voltage shift. In these embodiments, the control logic can perform a lookup in the lookup table (e.g., Table 2) to determine the read voltage offset for each of the R12, R10, and R5 based on the metadata value for the highest threshold voltage distribution (L15). This metadata value can be determined as characterizing the first read level voltage (R15) of the highest threshold voltage distribution (L15) of the subset of memory cells, e.g., based on analyzing results from a dual-strobe operation (see FIGS. 9-11B).

In these embodiments, the control logic can then adjust, based on the metadata value, a second read level voltage for a second-highest threshold voltage distribution of the subset of a group of memory cells, e.g., here, the R12 read level voltage. This adjustment can be performed by applying (e.g., adding or subtracting) the read voltage offset for the second read level voltage to the second read level voltage. The control logic can then, to perform an initial calibrated read of the subset of the group of memory cells, cause the adjusted second read level voltage to be applied to a wordline of the plurality of wordlines of the subset of memory cells to read the second-highest threshold voltage distribution. The control logic can carry out these calibrated reads to also the third read level voltage (R10) and the fourth read level voltage (R5) before performing calibrated reads of the third-highest threshold voltage distribution (L10) and the fourth-highest threshold voltage distribution (L5), respectively. In this way, not only is tR time conserved in not adjusting the first read level voltage (of R15), but also in not having to wait for the WL read voltage to drop and settle to a level needed to read/sense the lowest read level voltage, which is R5 in this example.

Figure 7B:
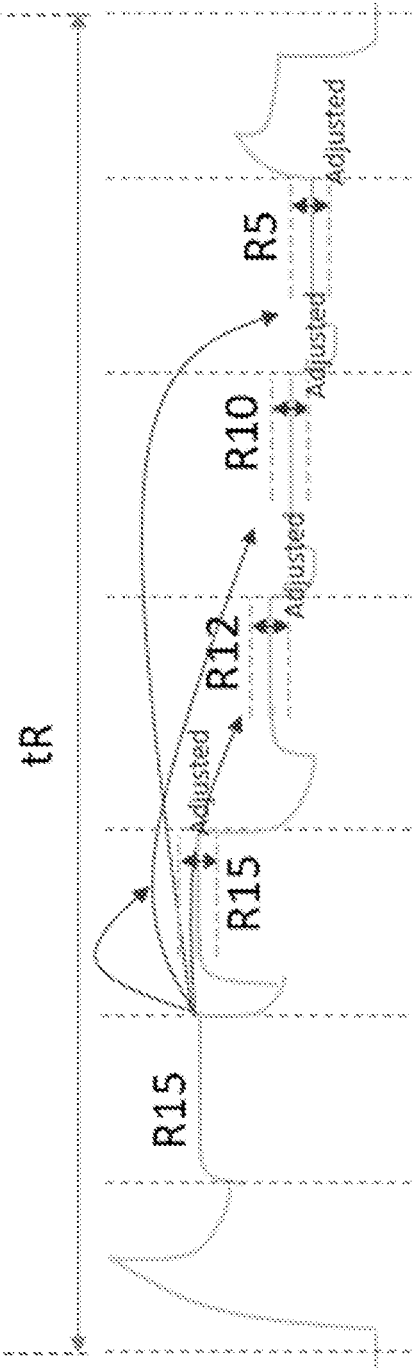
FIG. 7B is a graph depicting an example read calibration operation in which read level voltage adjustments are sequentially performed on memory cells of a page from a highest threshold voltage distribution to a lowest threshold voltage distribution according to at least one embodiment.

FIG. 7B is a graph depicting an example read calibration operation in which read level voltage adjustments are sequentially performed on memory cells of a page from a highest threshold voltage distribution to a lowest level voltage distribution according to at least one embodiment. In at least one embodiment, if the charge loss of the subset of the group of memory cells (e.g., for the TP) does satisfy the threshold voltage drop criterion (e.g., and is thus a larger charge loss than was determined in FIG. 7A), then the control logic first adjusts the R15 read level voltage for the highest voltage distribution before causing a sense operation to be performed at the first read level voltage (R15).

More specifically, in these embodiments, when the control logic performs a lookup in the lookup table (e.g., first column of Table 2), the control logic also determines a first read voltage offset for the highest threshold voltage distribution (L15) that maps to the metadata value. The control logic then applies the first read voltage offset to the first read level voltage to generate an adjusted first read level voltage, and causes, to perform an initial calibrated read of the subset of the group of memory cells, the adjusted first read level voltage to be applied to the wordline to read the highest threshold voltage distribution. In this embodiment, once the calibrated read is performed on the highest threshold voltage distribution (L15) of the subset of memory cells, then the control logic performs the additional calibrated reads (including adjustments to corresponding read level voltages) sequentially from a second-highest threshold voltage distribution (L12) to a lowest threshold voltage distribution (L5), as was discussed with reference to FIG. 7A. In this way, although not as much tR time is conserved because the R15 read level voltage is adjusted and sensed, some tR time is still conserved over the embodiment of FIG. 6 by performing the calibrated read operation in reverse order, from the highest threshold voltage distribution to the lowest threshold voltage distribution.

Figure 8A:
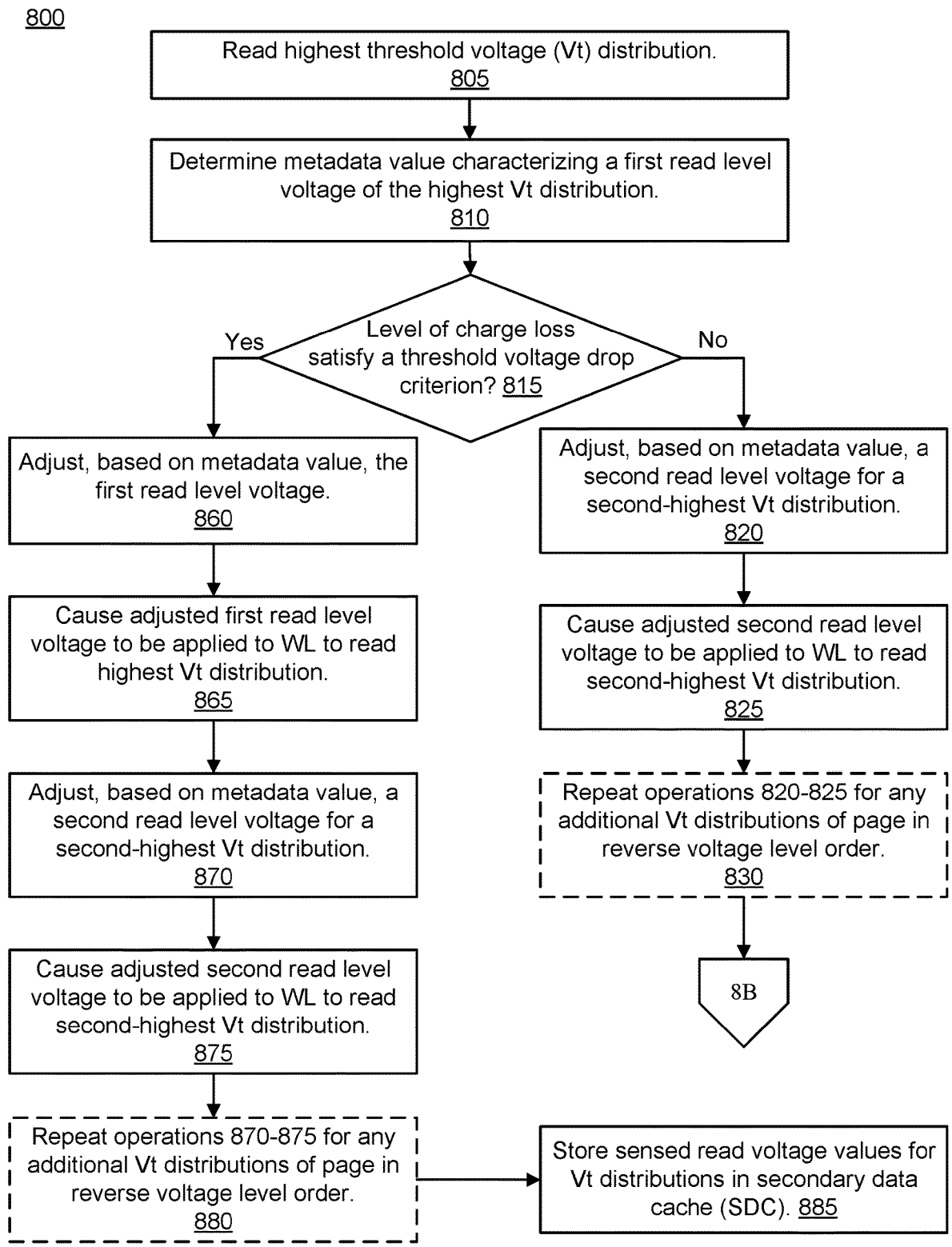
FIGS. 8A-8B are flow diagrams of an example method of performing a reverse read calibration in conjunction with a read operation performed on a group of memory cells according to various embodiments.
Figure 8B:
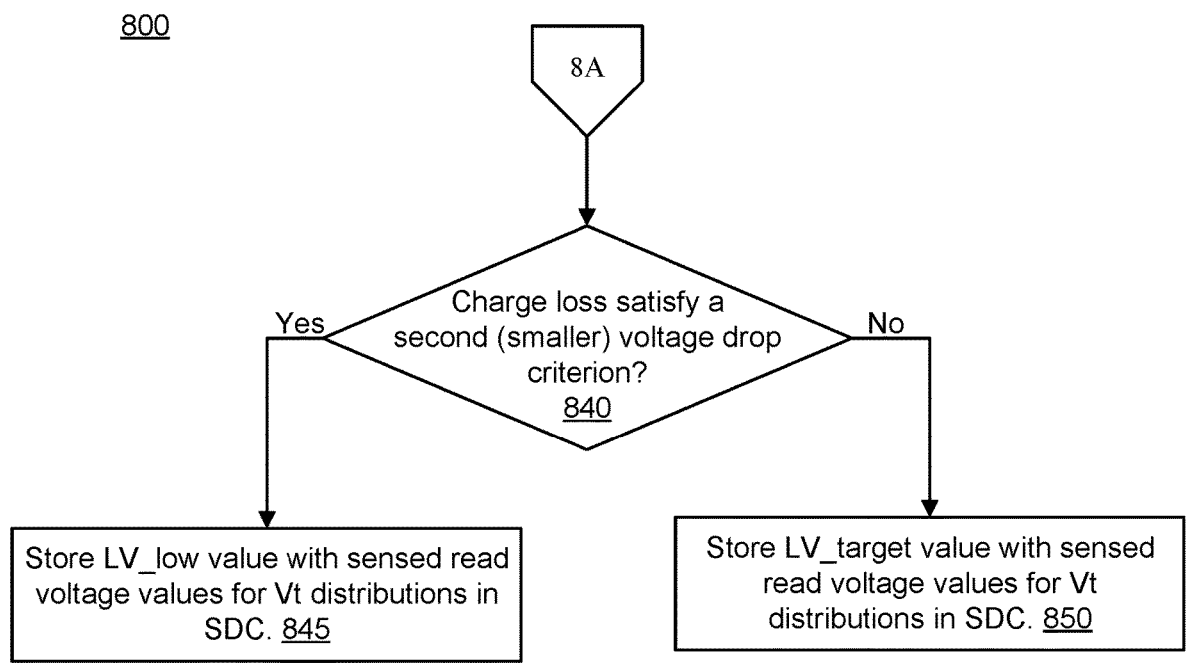

FIGS. 8A-8B are flow diagrams of an example method 800 of performing a reverse read calibration in conjunction with a read operation performed on a group of memory cells according to various embodiments. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the local media controller 135 (e.g., control logic) of FIGS. 1A-1B, e.g., by the calibration reader 137, on a memory array that includes a plurality of memory cells electrically coupled to a plurality of wordlines and a plurality of bitlines. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 805, a highest threshold voltage distribution of a subset of the group of memory cells is read. More specifically, the processing logic reads a highest threshold voltage distribution (Vt) by sensing a first read level voltage. In the QLC-based memory cells example discussed herein, the highest Vt distribution is the L15 Vt distribution for the TP subset of memory cells (but would be the L14 Vt distribution for the XP subset of memory cells, the L13 Vt distribution for the UP subset of memory cells, and the L11 Vt distribution for the LP subset of memory cells). To read the highest Vt distribution, the processing logic can cause a dual-strobe sensing operation to be performed at the first (or highest) read level voltage. Examples of such a dual-strobe sensing operation are discussed with reference to FIGS. 10-11B.

At operation 810, a metadata value is determined. More specifically, the processing logic determines a metadata value characterizing the first read level voltage of the highest Vt distribution. The metadata value may be determined based on results of a first read strobe of the dual-strobe sensing performed in operation 805, for example (see FIGS. 9-11B).

At operation 815, a charge loss is analyzed. More specifically, the processing logic determines whether a charge loss of the subset of the group of memory cells satisfies a threshold voltage drop criterion. In some embodiments, the charge loss is determined according to a charge loss characteristic that is measured/determined by the dual-strobe sensing of operation 805 (see FIG. 9). In some embodiments, the charge loss is separately tracked and can be retrieved from storage or memory of the memory device 130. This charge loss characteristic is discussed in more detail with reference to FIG. 4 and FIGS. 5A-5C. In various embodiments, the threshold voltage drop criterion is set to be a threshold voltage change, corresponding to a particular charge loss or temporal voltage shift, such as 75 mV, 100 mV, 150 mV, 175 mV, or the like, where the threshold voltage change is associated with a relatively small time after program (TAP). Accordingly, the threshold voltage drop criterion can be user defined/programmed and satisfying the voltage drop criterion can include the charge loss (or temporal voltage shift) at least reaching (e.g., is greater than or equal to) the threshold voltage change.

In response to the charge loss not satisfying the threshold voltage drop criterion, at operation 820, a second read level voltage is adjusted. More specifically, the processing logic adjusts, based on the metadata value, a second read level voltage for a second-highest threshold voltage distribution of the subset of the plurality of memory cells. To perform this adjustment, the processing device can identify, in a lookup table, an entry mapping the metadata value to a corresponding read voltage offset and apply the corresponding read voltage offset to the second read level voltage.

At operation 825, a read is performed with the adjusted second read level voltage. More specifically, the processing logic causes, to perform an initial calibrated read of the subset of the group of memory cells, the adjusted second read level voltage to be applied to a wordline (e.g., the selected wordline) of the plurality of wordlines to read the second-highest threshold voltage distribution. Thus, the embodiment that includes operations 820 and 825 relate to the embodiment discussed with reference to FIG. 7A. The read performed at operation 825 can include performing a bitline precharge and a single strobe sensing of the wordline using the adjusted second read level voltage to determine a second sensed read voltage value.

At operation 830, additional calibrated reads are performed. More specifically, the processing logic optionally repeats operations 820 and 825 for any additional Vt distributions in reverse voltage level order. For example, the processing logic can adjust, based on the metadata value, a third read level voltage for a third-highest threshold voltage distribution of the subset of the plurality of memory cells. The processing logic can cause, to perform a second calibrated read of the subset of the group of memory cells, the adjusted third read level voltage to be applied to the wordline (e.g., selected wordline) to read the third-highest threshold voltage distribution. In this embodiment, the second calibrated read is performed sequentially after the first calibrated read. The read performed of the third-highest threshold voltage distribution can include performing a bitline precharge and a single strobe sensing of the wordline using the adjusted third read level voltage to determine a third sensed read voltage value.

Further, the processing logic can adjust, based on the metadata value, a fourth read level voltage for a fourth-highest threshold voltage distribution of the subset of the plurality of memory cells. The processing logic can further cause, to perform a third calibrated read of the subset of the group of memory cells, the adjusted fourth read level voltage to be applied to the wordline to read the fourth-highest threshold voltage distribution. In this embodiment, the third calibrated read is performed sequentially after the second calibrated read. The read performed of the fourth-highest threshold voltage distribution can include performing a bitline precharge and a single strobe sensing of the wordline using the adjusted fourth read level voltage to determine a fourth sensed read voltage value.

With additional reference to FIG. 8B, at operation 840, a charge loss is compared. More specifically, the processing logic determines, based on a charge loss characteristic of the highest threshold voltage distribution, whether a charge loss of the subset of the memory cells does not satisfy a second threshold voltage drop criterion. In this embodiment, the second threshold voltage drop criterion is smaller than the threshold voltage drop criterion to which the charge loss was compared at operation 815, and thus the comparison of operation 840 is a finer comparison to determine whether the charge loss is statistically close to zero ("0") or whether some charge loss exists.

In response to the charge loss satisfying the second threshold voltage drop criterion, at operation 845, a low read level voltage (LV_low) value is stored. More specifically, the processing logic stores the low read level voltage value with sensed read voltage values for the threshold voltage (Vt) distribution(s) of the page in a secondary data cache (SDC). As will be discussed with reference to FIG. 9 and Table 3, the LV_low value can be obtained from a primary data cache (PDC), as having been previously stored in the PDC.

In response to the charge loss not satisfying the second threshold voltage drop criterion, at operation 850, a target read level voltage (LV_target) value is stored. More specifically, the processing logic stores the target read level voltage with the sensed read voltage values for the respective threshold voltage (Vt) distributions of the page in the SDC. As will be discussed with reference to FIG. 9 and Table 3, the LV_target value can also be obtained from the primary data cache (PDC).

With renewed reference to FIG. 8A, in response to, at operation 815, the charge loss satisfying the threshold voltage drop criterion, at operation 860, a first read level voltage is adjusted. More specifically, the processing logic adjusts the first read level voltage based on the metadata value.

At operation 865, the adjusted first read level voltage is used. More specifically, the processing logic causes, to perform an initial calibrated read of the subset of the group of memory cells, the adjusted first read level voltage to be applied to a wordline of the memory array to read the highest threshold voltage distribution. Thus, the embodiment that includes operations 860 and 865 relate to the embodiment discussed with reference to FIG. 7B. The read performed at operation 865 can include performing a bitline precharge and a single strobe sensing of the wordline using the adjusted first read level voltage to determine a first sensed read voltage value.

At operation 870, a second read level voltage is adjusted. More specifically, the processing logic adjusts, based on, a second read level voltage for a second-highest threshold voltage distribution of the subset of the plurality of memory cells. To perform this adjustment, the processing device can identify, in a lookup table, an entry mapping the metadata value to a corresponding read voltage offset and apply the corresponding read voltage offset to second read level voltage.

At operation 875, a read is performed with the adjusted second read level voltage. More specifically, the processing logic causes, to perform a second calibrated read of the subset of the group of memory cells, the adjusted second read level voltage to be applied to a wordline (e.g., the selected wordline) of the plurality of wordlines to read the second-highest threshold voltage distribution. In this embodiment, the second calibrated read is sequentially performed after the first calibrated read. The read performed at operation 875 can include performing a bitline precharge and a single strobe sensing of the wordline using the adjusted second read level voltage to determine a second sensed read voltage value.

At operation 880, additional calibrated reads are performed. More specifically, the processing logic optionally repeats operations 870 and 875 for any additional Vt distributions in reverse voltage level order. For example, the processing logic can adjust, based on the metadata value, a third read level voltage for a third-highest threshold voltage distribution of the subset of the plurality of memory cells. The processing logic can further cause, to perform a third calibrated read of the subset of the group of memory cells, the adjusted third read level voltage to be applied to the wordline (e.g., selected wordline) to read the third-highest threshold voltage distribution. In this embodiment, the third calibrated read is performed sequentially after the second calibrated read. The read performed of the third-highest threshold voltage distribution can include performing a bitline precharge and a single strobe sensing of the wordline using the adjusted third read level voltage to determine a third sensed read voltage value.

Further, the processing logic can adjust, based on the metadata value, a fourth read level voltage for a fourth-highest threshold voltage distribution of the subset of the plurality of memory cells. The processing logic can further cause, to perform a fourth calibrated read of the subset of the group of memory cells, the adjusted fourth read level voltage to be applied to the wordline to read the fourth-highest threshold voltage distribution. In this embodiment, the fourth calibrated read is performed sequentially after the third calibrated read. The read performed of the fourth-highest threshold voltage distribution can include performing a bitline precharge and a single strobe sensing of the wordline using the adjusted fourth read level voltage to determine a fourth sensed read voltage value.

At operation 885, the sensed read voltage values are stored. More specifically, the processing logic stores, in the SDC, the first sensed read voltage value for the highest threshold voltage distribution, the second sensed read voltage value for the second-highest threshold voltage distribution, and so forth for any third-highest, fourth-highest, or higher threshold voltage distribution depending on the memory type and the number of Vt distributions exists in the page. These sensed read voltage values can then be employed for subsequent read operations at the page.

Figure 9:
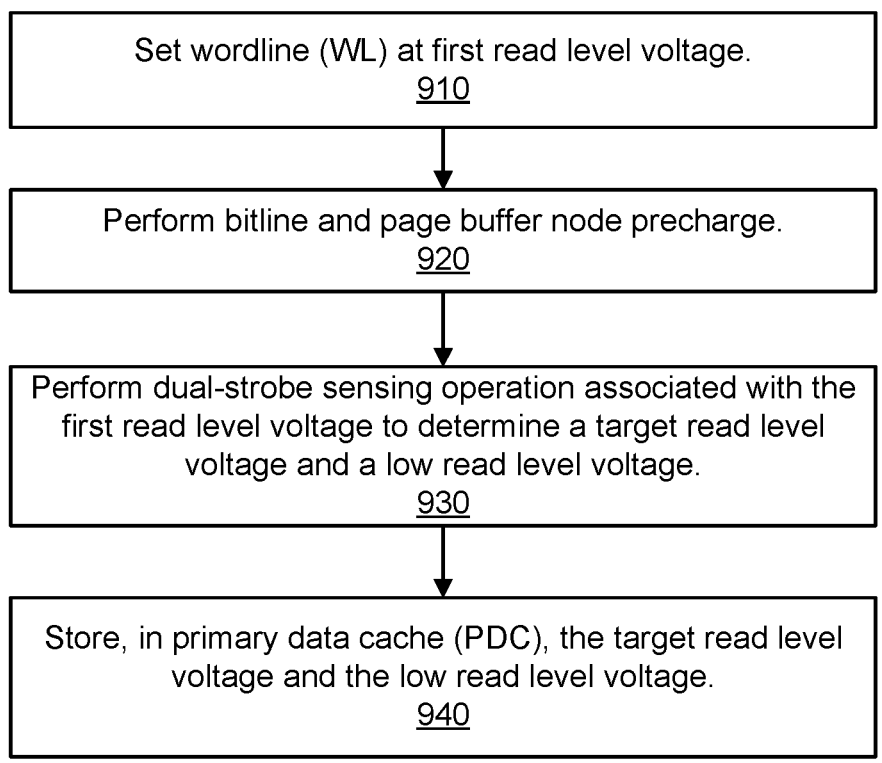
FIG. 9 is a flow diagram of an example method for performing a dual-strobe sensing operation to determine read levels associated with a highest threshold voltage distribution according to at least one embodiment.

FIG. 9 is a flow diagram of an example method 900 for performing a dual-strobe sensing operation to determine read levels associated with a highest threshold voltage distribution according to at least one embodiment. The method 900 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 900 is performed by the local media controller 135 (e.g., control logic) of FIGS. 1A-1B, e.g., by the calibration reader 137. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In at least one embodiment, the operations of FIG. 9 are performed in order to carry out operation 805 of FIG. 8A and thus involves preliminary operations of a read calibration of a subset of a group of multi-level cells (e.g., MLC, TLC, or QLC-based memory cells). FIG. 10 is a graph of a number of memory cells versus threshold voltage distribution illustrating waveforms before and after charge loss and identifying a target read level voltage (LV_target) and a low read level voltage (LV_low) that is lower than the target read level voltage according to an embodiment. These LV_target and LV_low read level voltages will be referred to below.

At operation 910, a wordline (WL) voltage is set. More specifically, the processing logic causes a WL voltage of a selected wordline to be set to a first read level voltage, e.g., a target read level voltage (LV_target). Also, the processing logic may cause unselected wordlines to be boosted to mitigate read disturb effects on the memory cells connected to the selected wordline.

At operation 920, bitlines and page buffers are precharged. More specifically, the processing logic causes bitlines and one or more page buffer nodes (e.g., Tc nodes) to be precharged in preparation for the reverse read calibration operation, which is described in detail with reference to FIGS. 8A-8B.

At operation 930, a dual-strobe sensing operation is performed. More specifically, the processing logic performs a dual-strobe sensing operation associated with the first read level voltage to sense at the target read level voltage (LV_target) and at the low read level voltage that is lower than the target read level voltage for the highest threshold voltage distribution. As discussed with reference to FIG. 5A, the dual-strobe sensing operation can estimate a charge loss between the target read level (LV_target) and the low read level voltage (LV_low) using a charge loss characteristic, which can be tracked and/or estimated based on tracking temporal voltage shift of the group of memory cells from which the subset of the memory cells is derived. Further, the dual-strobe sensing operation can be performed in one of multiple ways, two of which include boost modulation (FIGS. 11A-11B) and t-sense modulation.

At operation 940, the target read level voltage (LV_target) and the low read level voltage (LV_low) are stored. More specifically, the target read level voltage and the low read level voltage are stored in the a primary data cache (PDC), e.g., for fast retrieval in order to perform additional operations of the overall reverse read calibration operation.

TABLE 3

| Page | pdc4 | pdc3 | pdc2 | pdc1 | pdc0 | sdc |
|---|---|---|---|---|---|---|
| LP/UP/XP/TP | L11/L13/L14/L15 | L11_low/L13_low/ L14_low/L15_low | | | | LP/UP/XP/TP |

In various embodiments, Table 3 illustrates, for different pages of QLC-based memory cells, how the PDC and the SDC of a page buffer (e.g., the page buffer 152) can be employed to store the LV_target, LV_low, and sensed read voltages for the various LP/UP/XP/TP pages, as an example. While PDC4 is employed for the LV_target values and PDC3 is employed for the LV_low values, different subsections of the PDC can be employed to store these read level voltages in other embodiments. Eventually, the LV_target or the LV_low is optionally stored with the sensed read voltages in the SDC, as applicable per operations 845 and 850 of FIG. 8B.

Figure 11A:
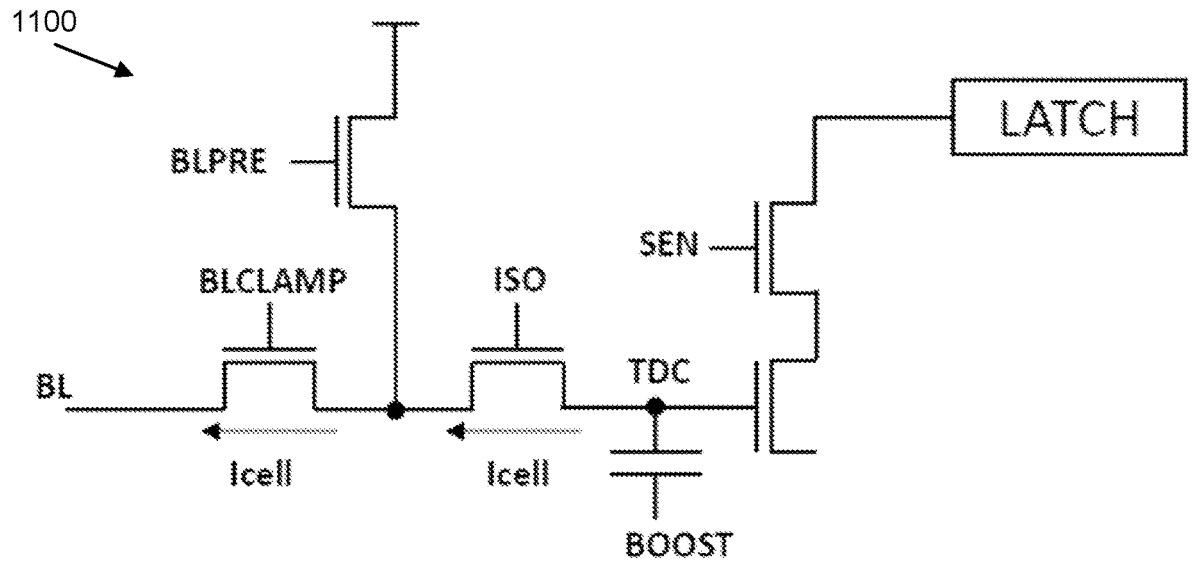
FIG. 11A is an example page buffer according to an embodiment.
Figure 11B:
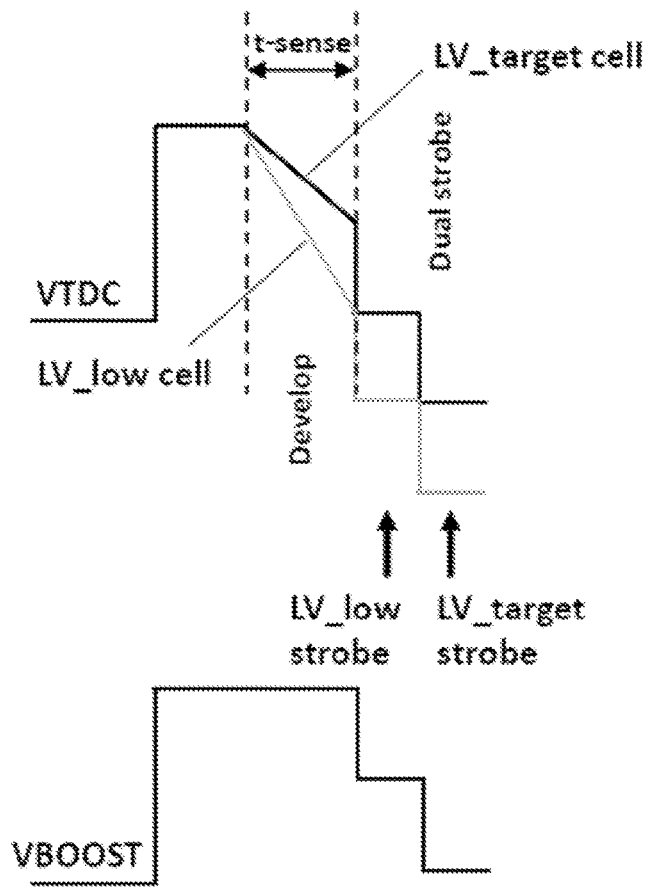
FIG. 11B is a set of graphs illustrating voltage at a boost node (Vboost) and at a sense capacitor (TDC), which illustrates boost modulation as a way to perform dual-strobe sensing, according to an embodiment.

FIG. 11A is an example page buffer 1100 according to an embodiment. In some embodiments, the page buffer 1100 is the page buffer 152 of FIGS. 1A-1B. FIG. 11B is a set of graphs illustrating voltage at a boost node (Boost) and at a sense capacitor (TDC), which illustrates boost modulation as a way to perform dual-strobe sensing, according to an embodiment. The page buffer 1100 can precharge a bitline voltage and the sense capacitor (TDC), and thus an amount of boost voltage (Vboost) provided at the boost node and to the back plate of the sense capacitor can cause a shift in reference sensing current within one or more memory cells. The Vboost can be modulated in order to cause a corresponding change in the voltage of the sense capacitor (Vtdc), as illustrated in FIG. 11B.

In an example of a dual-strobe sensing operation, Vtdc is discharged by the cell current during a development phase. The control logic (e.g., the calibration reader 137) can adjust the boost voltage (Vboost) depending on the target sensing level (LV_target). For the LV_low, the sensing cell current (Icell) should be higher so that Vboost is higher during LV_low strobe. In contrast, the Vboost is lower during LV_target strobe because the sensing cell current is smaller for sensing at the LV_target read level voltage. In this way, the memory device can avoid making any WL read level adjustment for sensing the two different voltage levels of the first (e.g., highest) threshold voltage distribution. This saves time and is faster than adjusting the WL voltage of the selected WL.

While not explicitly illustrated, t-sense modulation performs a similar function to that of boost modulation in providing multiple current sensing levels within the page buffer 1100 (and/or sense amplifier circuit), but in a different way. This t-sense modulation may be performed by adjusting a current sensing level based on an amount of time the sense amplifier circuit of the page buffer 1100 passes through a sense mode. One of the current sensing levels can be stored in a sense latch while the sense amplifier circuit is allowed to undergo the sense mode for a different period of time, thus generating a different sense current level by which to modulate the reference sensing current for a given memory cell or group of memory cells. By having both sensing current levels available within the sense amplifier circuit, the WL voltage can again be kept constant while different read level voltages are sensed, e.g., to implement the disclosed dual-strobe read operation. One example of t-sense modulation is discussed in U.S. Pat. No. 8,559,226, dated Oct. 15, 2013, which is hereby incorporated by this reference in its entirety.

Figure 12:
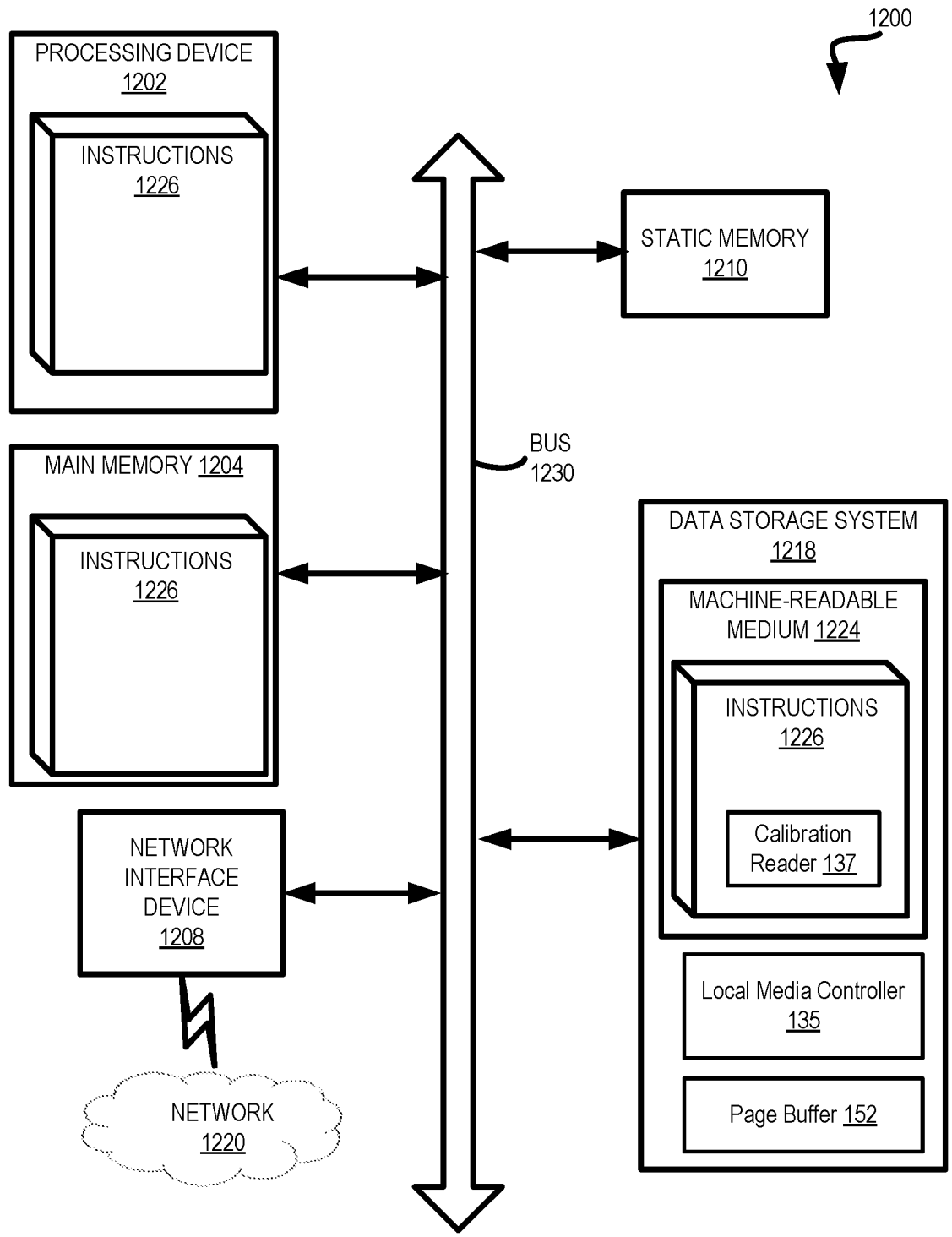
FIG. 12 is a block diagram of an example computer system in which embodiments of the present disclosure can operate.

FIG. 12 illustrates an example machine of a computer system 1200 within which a set of instructions, for causing the machine to perform any one or more of the methodologies discussed herein, can be executed. In some embodiments, the computer system 1200 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the memory sub-system controller 115 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1200 includes a processing device 1202, a main memory 1204 (e.g., read-only memory (ROM), flash memory, dynamic random access memory (DRAM) such as synchronous DRAM (SDRAM) or Rambus DRAM (RDRAM), etc.), a static memory 1210 (e.g., flash memory, static random access memory (SRAM), etc.), and a data storage system 1218, which communicate with each other via a bus 1230.

Processing device 1202 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1202 can also be one or more special-purpose processing devices such as an application specific integrated circuit (ASIC), a field programmable gate array (FPGA), a digital signal processor (DSP), network processor, or the like. The processing device 1202 is configured to execute instructions 1228 for performing the operations and steps discussed herein. The computer system 1200 can further include a network interface device 1212 to communicate over the network 1220.

The data storage system 1218 can include a machine-readable storage medium 1224 (also known as a non-transitory computer-readable storage medium) on which is stored one or more sets of instructions 1226 or software embodying any one or more of the methodologies or functions described herein, including those associated with the calibration reader 137. The data storage system 1218 can further include the local media controller 135 and the page buffer 152 that were previously discussed. The instructions 1228 can also reside, completely or at least partially, within the main memory 1204 and/or within the processing device 1202 during execution thereof by the computer system 1200, the main memory 1204 and the processing device 1202 also constituting machine-readable storage media. The machine-readable storage medium 1224, data storage system 1218, and/or main memory 1204 can correspond to the memory sub-system 110 of FIG. 1A.

In one embodiment, the instructions 1226 include instructions to implement functionality corresponding to a controller (e.g., the memory sub-system controller 115 of FIG. 1A). While the machine-readable storage medium 1224 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a memory array comprising a plurality of memory cells electrically coupled to a plurality of wordlines and a plurality of bitlines; and
control logic coupled with the memory array, the control logic to perform operations comprising:
determining a metadata value characterizing a first read level voltage of a highest threshold voltage distribution of a subset of the plurality of memory cells, wherein the metadata value comprises at least one of a failed byte count or a failed bit count;
adjusting, based on the metadata value, a second read level voltage for a second-highest threshold voltage distribution of the subset of the plurality of memory cells; and
causing, to perform an initial calibrated read of the subset of the plurality of memory cells, the adjusted second read level voltage to be applied to a wordline of the plurality of wordlines to read the second-highest threshold voltage distribution.

2. The memory device of claim 1, wherein the operations further comprise:
adjusting, based on the metadata value, a third read level voltage for a third-highest threshold voltage distribution of the subset of the plurality of memory cells; and
causing, to perform a second calibrated read of the subset of the plurality of memory cells, the adjusted third read level voltage to be applied to the wordline to read the third-highest threshold voltage distribution.

3. The memory device of claim 2, wherein the operations further comprise:
adjusting, based on the metadata value, a fourth read level voltage for a fourth-highest threshold voltage distribution of the subset of the plurality of memory cells; and
causing, to perform a third calibrated read of the subset of the plurality of memory cells, the adjusted fourth read level voltage to be applied to the wordline to read the fourth-highest threshold voltage distribution.

4. The memory device of claim 2, wherein the operations further comprise:
performing a bitline precharge and a single strobe sensing of the wordline using the adjusted second read level voltage to determine a second sensed read voltage value; and
performing a bitline precharge and a single strobe sensing of the wordline using the adjusted third read level voltage to determine a third sensed read voltage value.

5. The memory device of claim 1, wherein the operations further comprise:
performing a dual-strobe sensing operation associated with the first read level voltage to sense at a target read level voltage and at a low read level voltage that is lower than the target read level voltage for the highest threshold voltage distribution; and storing, in a primary data cache, the target read level voltage and the low read level voltage.

6. The memory device of claim 5, wherein the operations further comprise:
determining, based on a charge loss characteristic of the highest threshold voltage distribution, that a charge loss of the subset of the plurality of memory cells does not satisfy a threshold voltage drop criterion; and
storing, in a secondary data cache, the target read level voltage with a second sensed read voltage value for the second-highest threshold voltage distribution.

7. The memory device of claim 1, wherein adjusting the second read level voltage comprises:
identifying, in a lookup table, an entry mapping the metadata value to a corresponding read voltage offset; and
applying the corresponding read voltage offset to the second read level voltage.

8. The memory device of claim 1, wherein the subset of the plurality of memory cells is a memory page.

9. A method comprising:
determining a metadata value characterizing a first read level voltage of a highest threshold voltage distribution of a subset of a plurality of memory cells of a memory array, wherein the metadata value comprises at least one of a failed byte count or a failed bit count; and
in response to determining that a charge loss associated with the highest threshold voltage distribution satisfies a threshold voltage drop criterion:
adjusting, based on the metadata value, the first read level voltage;
causing, to perform an initial calibrated read of the subset of the plurality of memory cells, the adjusted first read level voltage to be applied to a wordline of the memory array to read the highest threshold voltage distribution;
adjusting, based on the metadata value, a second read level voltage for a second-highest threshold voltage distribution of the subset of the plurality of memory cells; and
causing, to perform a second calibrated read of the subset of the plurality of memory cells, the adjusted second read level voltage to be applied to the wordline to read the second-highest threshold voltage distribution.

10. The method of claim 9, further comprising:
adjusting, based on the metadata value, a third read level voltage for a third-highest threshold voltage distribution of the subset of the plurality of memory cells; and
causing, to perform a third calibrated read of the subset of the plurality of memory cells, the adjusted third read level voltage to be applied to the wordline to read the third-highest threshold voltage distribution.

11. The method of claim 10, further comprising:
adjusting, based on the metadata value, a fourth read level voltage for a fourth-highest threshold voltage distribution of the subset of the plurality of memory cells; and
causing, to perform a fourth calibrated read of the subset of the plurality of memory cells, the adjusted fourth read level voltage to be applied to the wordline to read the fourth-highest threshold voltage distribution.

12. The method of claim 9, further comprising:
performing a bitline precharge and a single strobe sensing of the wordline using the adjusted first read level voltage to determine a first sensed read voltage value; and
performing a bitline precharge and a single strobe sensing of the wordline using the adjusted second read level voltage to determine a second sensed read voltage value.

13. The method of claim 9, further comprising:
performing a dual-strobe sensing operation associated with the first read level voltage to sense at a target read level voltage and at a low read level voltage that is lower than the target read level voltage for the highest threshold voltage distribution; and
storing, in a primary data cache, the target read level voltage and the low read level voltage.

14. The method of claim 9, further comprising:
determining, based on a charge loss characteristic of the highest threshold voltage distribution, that the charge loss of the subset of the plurality of memory cells satisfies the threshold voltage drop criterion; and
storing, in a secondary data cache, a first sensed read voltage value for the highest threshold voltage distribution and a second sensed read voltage value for the second-highest threshold voltage distribution.

15. The method of claim 9, wherein adjusting the first read level voltage comprises:
identifying, in a lookup table, a first entry mapping the metadata value to a corresponding first read voltage offset; and
applying the corresponding the first read voltage offset to first read level voltage.

16. The method of claim 15, wherein adjusting the second read level voltage comprises:
identifying, in a lookup table, a second entry mapping the metadata value to a corresponding second read voltage offset; and
applying the corresponding the second read voltage offset to second read level voltage.

17. The method of claim 9, wherein the subset of the plurality of memory cells is a memory page.

18. A non-transitory computer-readable storage medium comprising instructions that, when executed by a controller managing a memory device, cause the controller to:
determine a metadata value characterizing a first read level voltage of a highest threshold voltage distribution of a subset of a plurality of memory cells of a memory array of the memory device, wherein the metadata value comprises at least one of a failed byte count or a failed bit count;
adjust, based on the metadata value, a second read level voltage for a second-highest threshold voltage distribution of the subset of the plurality of memory cells; and
cause, to perform an initial calibrated read of the subset of the plurality of memory cells, the adjusted second read level voltage to be applied to a wordline of the memory array to read the second-highest threshold voltage distribution.

19. The non-transitory computer-readable storage medium of claim 18, wherein the instructions are further to cause the controller to:
adjust, based on the metadata value, a third read level voltage for a third-highest threshold voltage distribution of the subset of the plurality of memory cells; and
cause, to perform a second calibrated read of the subset of the plurality of memory cells, the adjusted third read level voltage to be applied to the wordline to read the third-highest threshold voltage distribution.

20. The non-transitory computer-readable storage medium of claim 19, wherein the instructions are further to cause the controller to:
- adjust, based on the metadata value, a fourth read level voltage for a fourth-highest threshold voltage distribution of the subset of the plurality of memory cells; and
- cause, to perform a third calibrated read of the subset of the plurality of memory cells, the adjusted fourth read level voltage to be applied to the wordline for reading the fourth-highest threshold voltage distribution.

* * * * *